US011002765B1

(12) United States Patent
Lorek et al.

(10) Patent No.: US 11,002,765 B1
(45) Date of Patent: May 11, 2021

(54) NON-CONTACT VOLTAGE SENSING METHOD AND APPARATUS

(71) Applicant: Vizi Metering, Inc., Seattle, WA (US)

(72) Inventors: Michael C. Lorek, Seattle, WA (US); Aaron Block, Seattle, WA (US); Prabal Dutta, Seattle, WA (US)

(73) Assignee: Vizi Metering, Inc., Seattle, WA (US)

( * ) Notice: Subject to any disclaimer, the term of this patent is extended or adjusted under 35 U.S.C. 154(b) by 0 days.

(21) Appl. No.: 17/112,692

(22) Filed: Dec. 4, 2020

(51) Int. Cl.
  *G01R 15/14* (2006.01)
  *G01R 21/133* (2006.01)
  *G01R 13/02* (2006.01)

(52) U.S. Cl.
  CPC ......... *G01R 15/142* (2013.01); *G01R 21/133* (2013.01); *G01R 13/02* (2013.01)

(58) Field of Classification Search
  CPC .... G01R 15/142; G01R 15/16; G01R 15/165; G01R 15/207; G01R 21/133; G01R 19/0084; G01R 13/02; G01R 13/0218; G01R 27/2605; Y02B 90/20
  See application file for complete search history.

(56) References Cited

U.S. PATENT DOCUMENTS

| 2015/0192618 A1* | 7/2015 | Juds | H01G 4/306 |
| | | | 324/76.11 |
| 2018/0136263 A1* | 5/2018 | Steuer | G01R 15/142 |

OTHER PUBLICATIONS

Ren, Sotara et. al., A development of capacitive voltage sensor for non-intrusive energy meter, 2018, IEEE (Year: 2018).*

* cited by examiner

*Primary Examiner* — Son T Le
*Assistant Examiner* — Dustin R Dickinson
(74) *Attorney, Agent, or Firm* — ÆON Law; Adam L. K. Philipp; David V. H. Cohen

(57) ABSTRACT

A non-contact electric potential meter system to determine voltage between an AC conductor and a reference potential without direct electrical contact to the conductor. A housing provides a shielded measurement region that excludes other conductors and holds power supply means; an AC voltage sensing mechanism includes a conductive sense plate and an electrical connection to the reference potential. Waveform-sensing electronic circuitry obtains an AC voltage waveform induced by capacitive coupling between the conductor and the conductive sense plate. Capacitance-determining electronic circuitry obtains a scaling factor based on the coupling capacitance formed between the conductor and the conductive sense plate. Signal processing electronic circuitry uses the AC voltage waveform and the coupling capacitance-based scaling factor to obtain the voltage between the conductor and the reference potential.

22 Claims, 12 Drawing Sheets

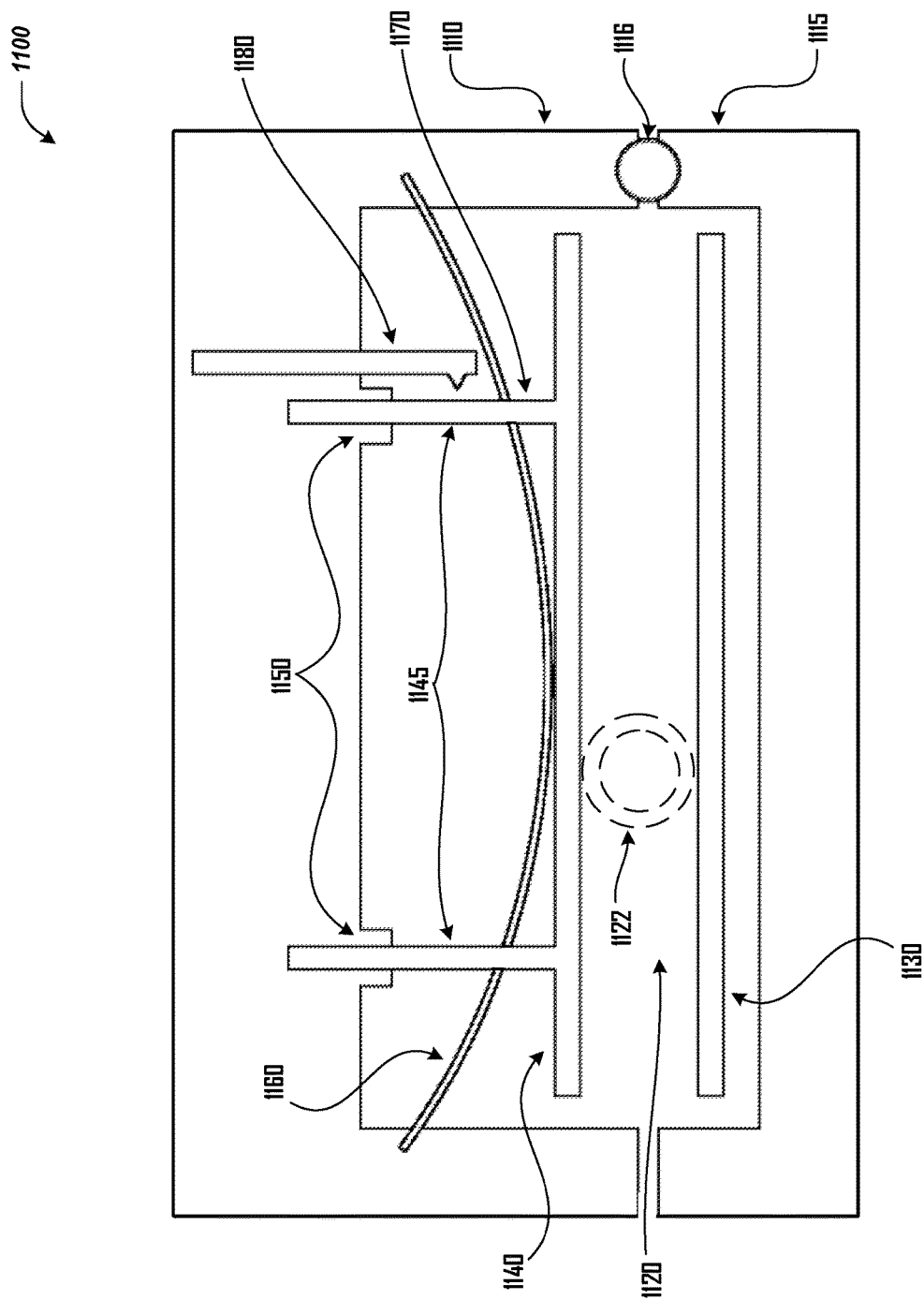

NON-CONTACT VOLTAGE SENSING METHOD AND APPARATUS

FIELD

This disclosure is directed to improved systems and methods of measuring electric potential in an alternating current ("AC") conductor.

BACKGROUND

Traditional approaches to measure AC voltage require making electrical contact with a target conductor and with a reference potential, forming a path with a voltmeter in parallel with the circuit to be measured.

BRIEF DESCRIPTION OF THE DRAWINGS

FIG. 11 illustrates physical components of an example conductor fixing and measurement system including a digital caliper in accordance with one embodiment.

DETAILED DESCRIPTION

Figure 1:
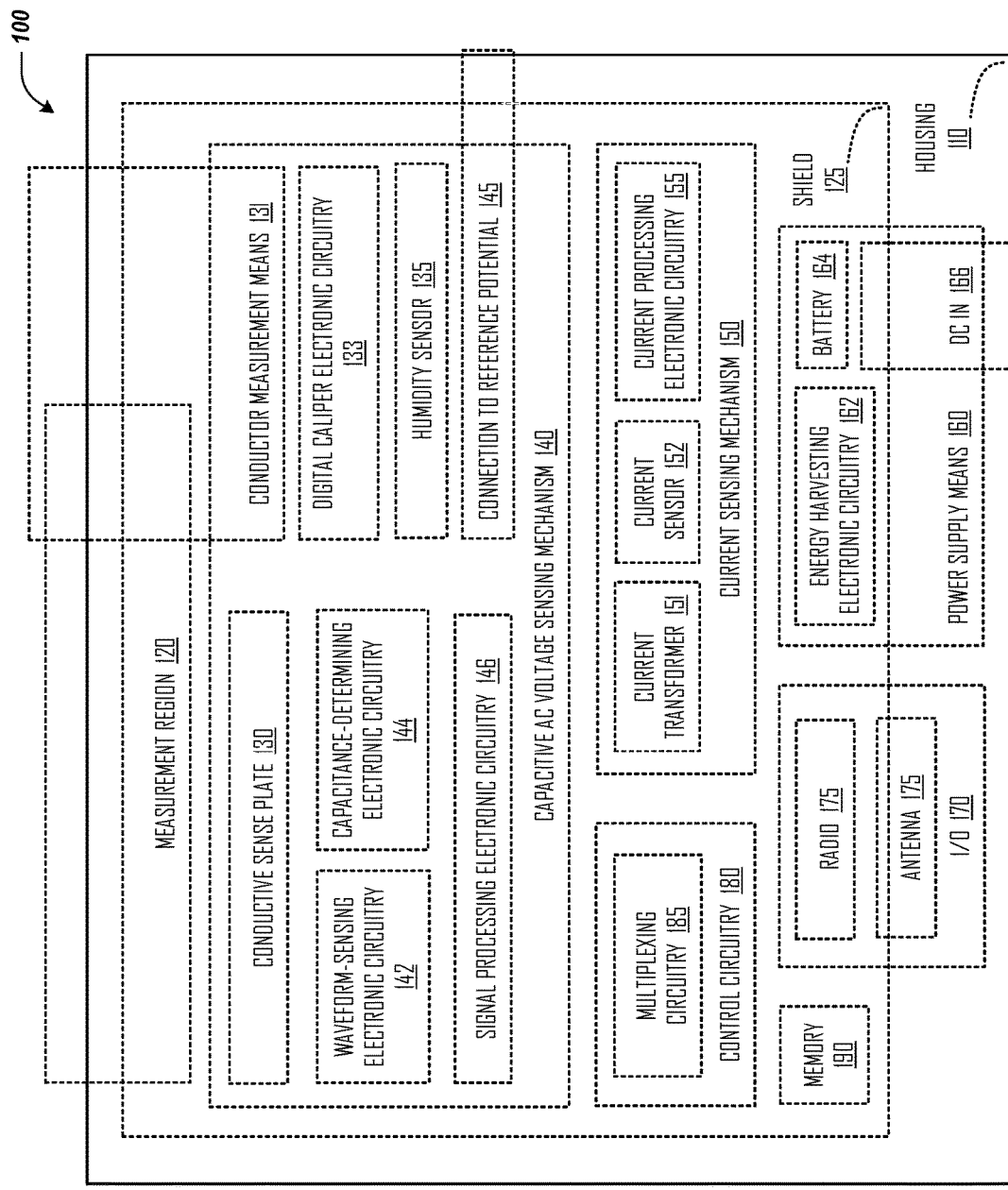
FIG. 1 is a block diagram illustrating operational components of an example non-contact voltage sensing apparatus in accordance with various embodiments.

This application discloses a non-contact electric potential meter system suitable for obtaining a determination of a voltage between a reference potential and an energized or "hot" conductor of an alternating current electrical circuit, without direct electrical contact to the first hot conductor and without reference to any other AC voltage signal.

The technical advancements of the non-contact voltage sensing apparatus disclosed herein allow it to overcome the limitations of prior power meters and offer significant advantages over prior art electric voltage measuring devices. For example, the disclosed voltage sensing apparatus uses a non-contact capacitive coupling system and technique to measure the voltage signal in an AC conductor. This allows accurate voltage sensing—measurement of a properly shaped and scaled waveform, not just peak detection—without requiring physical contact to the hot conductor wire.

The disclosed technology obtains an AC waveform in a target energized conductor via capacitive coupling between the conductor and a sense plate that is situated near the conductor. An electronic circuit samples a waveform representing a filtered version of the AC voltage between the energized conductor and a reference potential. Another circuit determines the coupling capacitance between the conductor and the sense plate. Together, these allow analog or digital signal processing circuitry to recover the shape or frequency spectrum of the line voltage and to correctly scale the recovered waveform. Thus, the non-contact voltage sensing apparatus disclosed herein accurately determines the AC line voltage.

In addition, the disclosed technology allows a split-core current transformer (CT) to provide current measurements of the target conductor and provides a multiplexing circuit to repurpose the current transformer (when it is not actively measuring current) as an energy harvester to supply runtime power for the non-contact voltage sensing apparatus. In some embodiments, a CT functions as a current sensor and energy harvester without multiplexing. For example, by estimation or calculation of energy harvester output voltage, current, or power, both energy harvesting and current sensing functions may be operated at the same time. Harvesting energy to power the non-contact voltage sensing apparatus and simultaneously measuring the current flowing in the target conductor can increase energy efficiency. For another example, components (such as energy harvesting electronic circuitry) may be turned off when current sensing circuitry is active.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications, and equivalents. In alternate embodiments, additional sensing devices, or combinations of illustrated devices, may be added to, or combined, without limiting the scope to the embodiments disclosed herein. Each of the Figures discussed below may include many more or fewer components than those shown and described. Moreover, not all of the described components may be required to practice various embodiments, and variations in the arrangements and types of the components may be made. However, the components shown are sufficient to disclose various illustrative embodiments for practicing the disclosed technology.

The embodiments set forth below are primarily described in the context of measuring electric circuits such as residential, commercial, industrial, or utility-level wiring (including, e.g., power transmission and distribution networks). However, the embodiments described herein are illustrative examples and in no way limit the disclosed technology to any particular size, construction, or application of conductor.

The phrases "in one embodiment," "in various embodiments," "in some embodiments," and the like are used repeatedly. Such phrases do not necessarily refer to the same embodiment. The terms "comprising," "having," and "including" are synonymous, unless the context dictates otherwise. As used in this specification and the appended claims, the singular forms "a," "an," and "the" include plural referents unless the content clearly dictates otherwise. For example, "a scaling factor" generally includes multiple scaling factors. It should also be noted that the term "or" is generally employed in its sense including "and/or" unless the content clearly dictates otherwise.

The terms "sense"/"sensing," "meter"/"metering," "detect"/"detecting," and "measure"/"measuring" are generally synonymous, unless the context dictates otherwise. For example, "detecting" an AC waveform generally refers to obtaining measurement of a continuously varying alternating current, and not only obtaining a Boolean value representing whether an AC waveform is present. A "detector" likewise should be interpreted as a device to obtain measurements and not only to detect presence. The terms "electric" and "electrical" are generally synonymous. The terms "voltage" and "potential" or "electric(al) potential" are also generally synonymous. Similarly, the terms "amperage" and "current" or "electric(al) current" are generally synonymous. Thus, the terms "voltage sensing apparatus" and "electric potential meter system" are used synonymously.

The disclosed non-contact voltage sensing apparatus can take a variety of form factors. FIGS. 1 through 12 illustrate a variety of different arrangements, designs, and subsystem possibilities. The illustrated sensing systems and methods are not an exhaustive list; in other embodiments, a measurement region for receiving a conductor or circuitry for powering and/or controlling a non-contact voltage sensing apparatus could be formed in different arrangements. However, it is not necessary to exhaustively show such optional implementation details to describe illustrative embodiments.

FIG. 1 is a block diagram illustrating operational components of an example non-contact voltage sensing apparatus 100 in accordance with one embodiment. The apparatus 100 typically includes a housing 110. The apparatus 100 includes a measurement region 120 that is configured to receive a conductor, e.g., a "hot" AC conductor (or "line") such as an insulated copper wire. The non-contact voltage sensing apparatus 100 is configured so that when the measurement region 120 receives the conductor, the conductor is not interrupted. In various embodiments, the measurement region 120 in operation receives a single conductor, and is configured to exclude other conductors (including, e.g., any additional "hot" wire). In various embodiments, the housing 110 provides, defines, or indicates the measurement region 120. In various embodiments, the measurement region 120 is configured such that the conductor passes along, into, or through the measurement region 120. Thus, the measurement region 120 may be arranged inside and/or outside the housing 110.

The non-contact voltage sensing apparatus 100 further includes a shield 125. The shield 125 may be constructed of material having high conductivity, such as a metallic foil or mesh. In various embodiments, the shield 125 may form a Faraday cage around a portion or all of the components of the non-contact voltage sensing apparatus 100, such as around the measurement circuitry and conductive sense plate described below with respect to this FIG. 1. In some embodiments, the shield 125 may extend only partly around a portion or all of the components of the non-contact voltage sensing apparatus 100, and/or may include one or more apertures, e.g., to accommodate a conductor in the measurement region 120. In some embodiments, the shield 125 does not surround the measurement region 120. In some embodiments, the shield 125 is connected to a ground potential.

The illustrated non-contact voltage sensing apparatus 100 includes a capacitive AC voltage sensing mechanism 140. The voltage sensing mechanism 140 includes components configured to obtain a determination of an AC voltage in a conductor in the measurement region 120, such as by sensing an AC line voltage waveform, determining a scaling factor based on coupling capacitance, and processing the waveform and the scaling factor as further described in this disclosure.

The capacitive AC voltage sensing mechanism 140 includes a conductive sense plate 130 configured so that the conductive sense plate 130 forms a capacitive coupling with a conductor in the measurement region 120. The non-contact voltage sensing apparatus 100 further includes an electrical connection to a reference potential 145, used in determining a voltage between the conductor and the reference potential. The electrical connection to a reference potential 145 may include a resistive or capacitive connection to a ground potential.

In various embodiments, the non-contact voltage sensing apparatus 100 is configured so that the conductive sense plate 130 has a determined or otherwise determinable geometric relationship to the conductor when the measurement region 120 receives the conductor. The geometric relationship between the conductor and the conductive sense plate 130, and, e.g., the size or other physical characteristics of the conductor (such as a wire gauge and/or insulation jacket thickness) may be known, fixed, or pre-set; or they may be measurable or similarly determinable. In some embodiments, the non-contact voltage sensing apparatus 100 includes conductor measurement means 131 to fix and/or measure one or more aspects of the conductor at the measurement region 120. An example conductor measurement means 131 and digital caliper electronic circuitry 133 is described in further detail with reference to FIG. 11 below. In some embodiments, the non-contact voltage sensing apparatus 100 includes a humidity sensor 135, so that the apparatus 100 can identify and compensate for changes in the dielectric constant of air associated with changes in humidity.

The capacitive AC voltage sensing mechanism 140 includes waveform-sensing electronic circuitry 142 configured to sense an AC line voltage waveform. The waveform-sensing electronic circuitry 142 may obtain the AC waveform by measuring a current induced via capacitive coupling between the sense plate 130 and an energized conductor in the measurement region 120. The waveform-sensing electronic circuitry 142 may include an operational amplifier ("op-amp") circuit, such as described in further detail with reference to FIG. 7 below.

The capacitive AC voltage sensing mechanism 140 further includes capacitance-determining electronic circuitry 144 (also referred to herein as coupling capacitance tracking electronic circuitry) configured to sense a coupling capacitance between the conductive sense plate 130 and the conductor in the measurement region 120. In some embodiments, the capacitance-determining electronic circuitry 144 includes elements having an output frequency that depends in part on the coupling capacitance, such as described in further detail with reference to FIG. 8 below.

The capacitive AC voltage sensing mechanism 140 further includes signal processing electronic circuitry 146. The signal processing electronic circuitry 146 processes the AC line voltage waveform representation obtained by the waveform-sensing electronic circuitry 142 to recover a shape or frequency spectrum of the line voltage waveform. The signal processing electronic circuitry 146 may process the coupling capacitance determination obtained by the capacitance-determining electronic circuitry 144 to obtain a scaling factor.

The signal processing electronic circuitry 146 may also use the determination of one or more physical characteristics of the conductor obtained by the conductor measurement means 131 (e.g., via the digital caliper electronic circuitry 133) to obtain a scaling factor. The signal processing electronic circuitry 146 scales the recovered shape or frequency spectrum of the line voltage waveform according to the scaling factor(s) to obtain an accurate measurement of the true AC line voltage in the conductor in the measurement region 120. In various embodiments, the signal processing electronic circuitry 146 may include analog and/or digital signal processing components.

In some embodiments, the non-contact voltage sensing apparatus 100 includes a current sensing mechanism 150. The current sensing mechanism 150 may include a current transformer ("CT") 151, a current sensor 152, and current processing electronic circuitry 155. The current sensor 152 may be a split-core current transformer, a solid-core current transformer, a Rogowski coil, an anisotropic magnetoresistance (AMR) sensor, a giant magnetoresistance (GMR) sensor, a Hall effect sensor, a current-sensing resistor, an inductor, etc. In some embodiments, the signal processing electronic circuitry 146 can process and time-synchronize a current waveform and a voltage waveform to obtain a determination of a power factor based on the detected AC electric current and voltage.

In various embodiments, the non-contact voltage sensing apparatus 100 includes power supply means 160 configured to power the electronic circuitry of the non-contact voltage sensing apparatus 100. For example, the power supply means 160 may include a stored energy system such as a capacitor or battery 164; an external power supply such as a direct current ("DC") voltage source 166; or means for obtaining energy from an AC conductor, such as energy harvesting electronic circuitry 162. For example, the power supply means 160 may be configured to obtain power from the conductor via the measurement region 120, e.g., via the current transformer 151 of the current sensing mechanism 150.

In various embodiments, the non-contact voltage sensing apparatus 100 includes control circuitry 180. The control circuitry 180 may include multiplexing circuitry 185 configured to share or switch components among or between circuits. For example, the control circuitry 180 may multiplex 185 the conductive sense plate 130 between the waveform-sensing electronic circuitry 142 and the capacitance-determining electronic circuitry 144. As another example, the control circuitry 180 may multiplex 185 the current transformer 151 between the current sensing mechanism 150 and the energy harvesting electronic circuitry 162. The multiplexing circuitry 185 may reconfigure subcircuits to include or exclude components such that they can perform multiple functions without interfering with one another. The multiplexing circuitry 185 may operate according to various algorithms based on time (e.g., at even, uneven, or irregular intervals or according to a schedule), need (e.g., based on one or more signals received by the control circuitry 180, such as a battery 164 level), sensed voltage and/or current values, or other factors.

In addition, the control circuitry 180 may be configured to combine properly scaled sampled waveforms measured by the voltage sensing mechanism 140 (e.g., by the waveform-sensing electronic circuitry 142, scaled according to the capacitance-determining electronic circuitry 144) with current measurements obtained by the current sensing mechanism 150, allowing the non-contact voltage sensing apparatus 100 to calculate a power dissipation, power delivery, or power factor, among other possible calculations including real, reactive, and apparent power.

In various embodiments, a data bus connects the various internal systems and logical components of the non-contact voltage sensing apparatus 100. For example, the control circuitry 180 may include circuitry to cause measurements to be recorded to memory 190 and/or transmitted via input/output ("I/O") components 170 such as a radio 175 transceiver for transmitting and/or receiving radio frequency ("RF") signals (e.g., via low-power wide-area network ("LPWAN") [e.g., LoRa, Sigfox, LTE-M, NB-IoT, etc.], Bluetooth, Wi-Fi, ZigBee, cellular network connection, NFC, RFID, etc.) or other interface (e.g., a wired communication port such as USB, UART, etc.). The I/O components 170 may allow data (including, e.g., recorded voltage measurements) to be sent from the non-contact voltage sensing apparatus 100 to an external device or destination. The I/O components 170 may also allow instructions to be transmitted to the control circuitry 180 or other components of the non-contact voltage sensing apparatus 100 such as the memory 190. The I/O components 170 may interface with, e.g., specialized meter reading devices, mobile phones, desktop computers, laptops, tablets, wearable computers, or other computing devices that are configured to connect to the non-contact voltage sensing apparatus 100.

The memory 190 can include a combination of temporary and/or permanent storage, and both read-only memory ("ROM") and writable memory (e.g., random access memory ("RAM"), processor registers, and on-chip cache memories), writable non-volatile memory such as flash memory or other solid-state memory, hard drives, removable media, magnetically or optically readable discs and/or tapes, nanotechnology memory, synthetic biological memory, and so forth. A memory is not a propagating signal divorced from underlying hardware; thus, a memory and a computer-readable storage medium do not refer to a transitory propagating signal per se. The memory 190 includes data storage that contains programs, software, and/or information, such as an operating system (e.g., an embedded real-time operating system), application programs or functional routines, and data (e.g., data structures, database entries, waveform representations, measurement records, calculation results, etc.).

The non-contact voltage sensing apparatus 100 may include a subset or superset of the components described above. Additional components may include, e.g., a display screen (such as an LCD, LED, or OLED display screen or an e-ink display), a speaker for playing audio signals, a haptic feedback device for tactile output such as vibration, etc., an environmental sensor such as a temperature sensor, power managing or regulating systems, etc. In various embodiments, additional infrastructure as well as additional devices may be present. Further, in some embodiments, the functions described as being provided by some or all of the non-contact voltage sensing apparatus 100 may be implemented via various combinations of physical and/or logical devices, e.g., one or more replicated and/or distributed physical or logical devices. For example, in some embodiments, the non-contact voltage sensing apparatus 100 includes a sensor configured to capture and wirelessly transmit voltage parameters (shape, frequency components and phases, etc.) to an external device, and may or may not include any current sensing or signal processing circuitry.

Aspects of the non-contact voltage sensing apparatus 100 can be embodied in a specialized or special purpose computing device or data processor that is specifically programmed, configured, or constructed to perform one or more of the computer-executable instructions explained in detail herein. For example, the control circuitry 180 can be embodied in a microcontroller or an application-specific integrated circuit ("ASIC"). Various circuits or circuitry of the non-contact voltage sensing apparatus 100 may include or be embodied in a processing component that controls operation of the non-contact voltage sensing apparatus 100 in accordance with computer-readable instructions stored in memory 190. A processing component may be any logic processing unit, such as one or more central processing units ("CPUs"), graphics processing units ("GPUs"), digital signal processors ("DSPs"), field-programmable gate arrays ("FPGAs"), ASICs, etc. A processing component may be a single processing unit or multiple processing units in an electronic device or distributed across multiple devices. Aspects of the disclosed systems and methods can also be practiced in distributed computing environments where tasks or modules are performed by remote processing devices that are linked through a communications network, such as a local area network (LAN), wide area network (WAN), or the Internet, e.g., computing resources provisioned from a "cloud computing" provider. In a distributed computing environment, modules can be located in both local and remote memory storage devices. For example, in some embodiments, the non-contact voltage sensing apparatus 100 includes a sensor configured to capture voltage parameters at a first location, and signal processing circuitry at a second location remote from the first location. Such implementations allow remote voltage sensing around an electrical network at low cost with centralized computational resources.

Alternative implementations of the systems disclosed herein can employ systems having blocks arranged in different ways; and some blocks can be deleted, moved, added, subdivided, combined, and/or modified to provide alternative or sub combinations. Each of these blocks can be implemented in a variety of different ways. However, it is not necessary to show such infrastructure and implementation details or variations in FIG. 1 in order to describe an illustrative embodiment.

Figure 2:
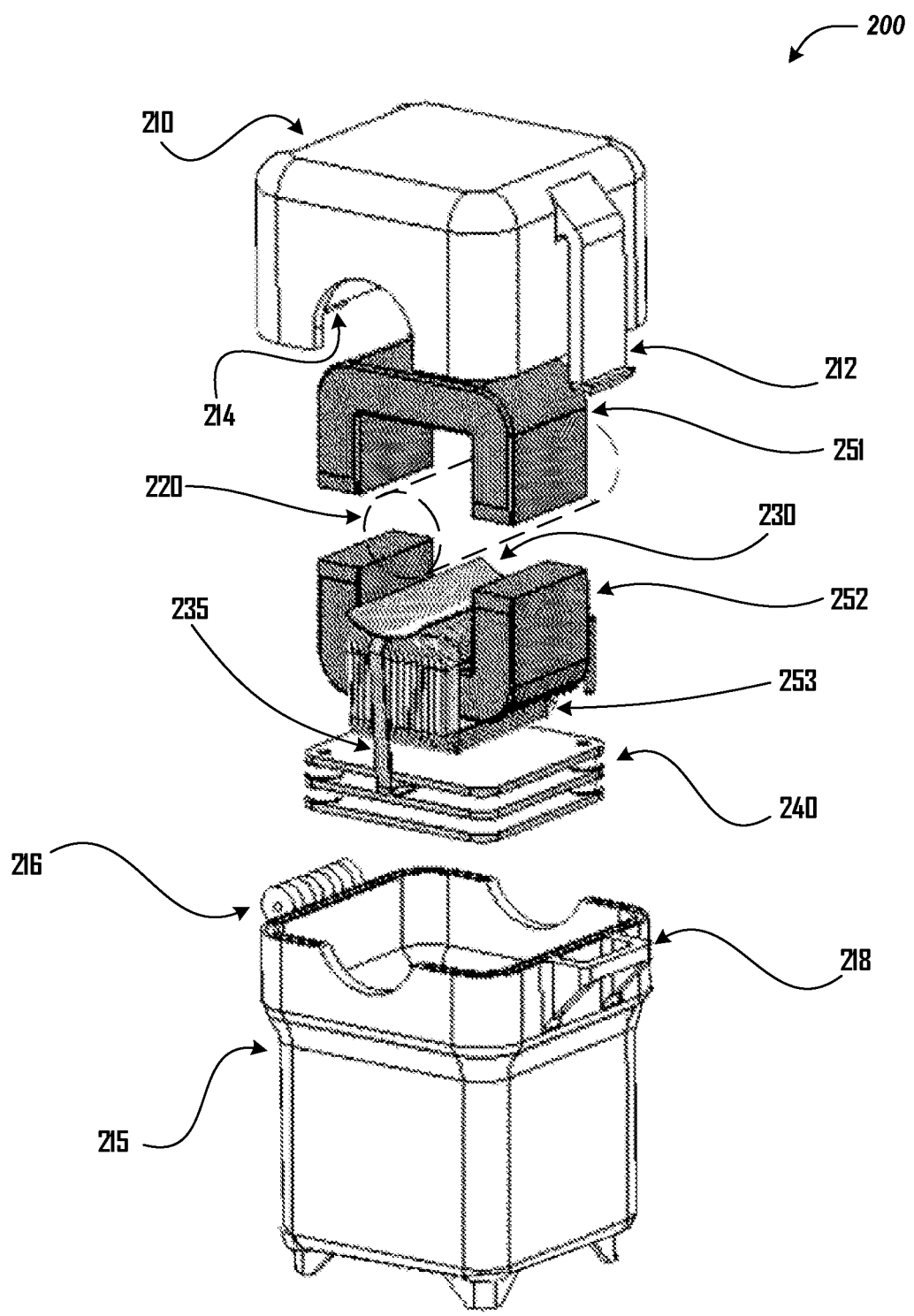
FIG. 2 illustrates an exploded isometric view of components of an example non-contact voltage sensing apparatus in accordance with one embodiment.

FIG. 2 illustrates an exploded isometric view of components of an example non-contact voltage sensing apparatus 200 in accordance with one embodiment. The example non-contact voltage sensing apparatus 200 includes a housing in two parts: an upper housing 210 and a lower housing 215. The upper housing 210 includes an upper hinge part 214, and the lower housing 215 includes a lower hinge part 216. Together, the upper hinge part 214 and the lower hinge part 216 form a hinge that allows the upper housing 210 and the lower housing 215 to hinge open and remain connected, providing an advantageous way to place the non-contact voltage sensing apparatus 200 around a conductor. When the hinges 214, 216 are engaged and the upper housing 210 and lower housing 215 are closed, a hook 212 on the upper housing 210 engages with a bar 218 on the lower housing 215 to secure the non-contact voltage sensing apparatus 200 around a conductor. The illustrated hinge and closure mechanisms are examples; alternative approaches could include any of a wide variety of mechanisms such as a friction fit or snap fit between the upper housing 210 and lower housing 215, a screw-on attachment, a magnetic attachment, a locking pin, a fastener securement, a hook-and-loop fabric securement, another style of mechanical latch, etc. Implementations without a split-core current transformer (e.g., with a one-piece transformer core or no current transformer) may have a housing in one part and include no closure mechanism at all.

When the non-contact voltage sensing apparatus 200 is closed, it provides a measurement region 220 for a conductor. In the illustrated embodiment, the measurement region 220 passes through the non-contact voltage sensing apparatus 200. In other embodiments, the measurement region may be arranged in other ways, such as along a non-contact voltage sensing apparatus, so that the apparatus can measure voltage in a conductor located at or against the apparatus without requiring the conductor to pass through the apparatus.

Adjacent to the measurement region 220 is a conductive sense plate 230. The conductive sense plate 230 is electrically connected to circuitry or electronics 240 by a connection 235.

The non-contact voltage sensing apparatus 200 includes a current transformer (e.g., a ferro-magnetic core, such as a ferrite or nanocrystalline core) divided into two parts: an upper core 251 within the upper housing 210, and a lower core 252 within the lower housing 215. The upper core 251 and the lower core 252 come together to form a complete loop around the measurement region 220. In some embodiments, the current transformer (CT) is one piece rather than a split core, which may only partially surround a conductor or may require a conductor to be threaded through the current transformer core. When a conductor is energized in the measurement region 220 and the non-contact voltage sensing apparatus 200 is closed around the conductor, windings 253 around the lower core 252 and connected to the electronics 240 enable the current transformer to sense current through the conductor and/or harvest energy from the conductor.

The present disclosure encompasses various arrangements and shapes of voltage sensing systems and is not limited to the embodiment described via this illustrative example.

Figure 3:
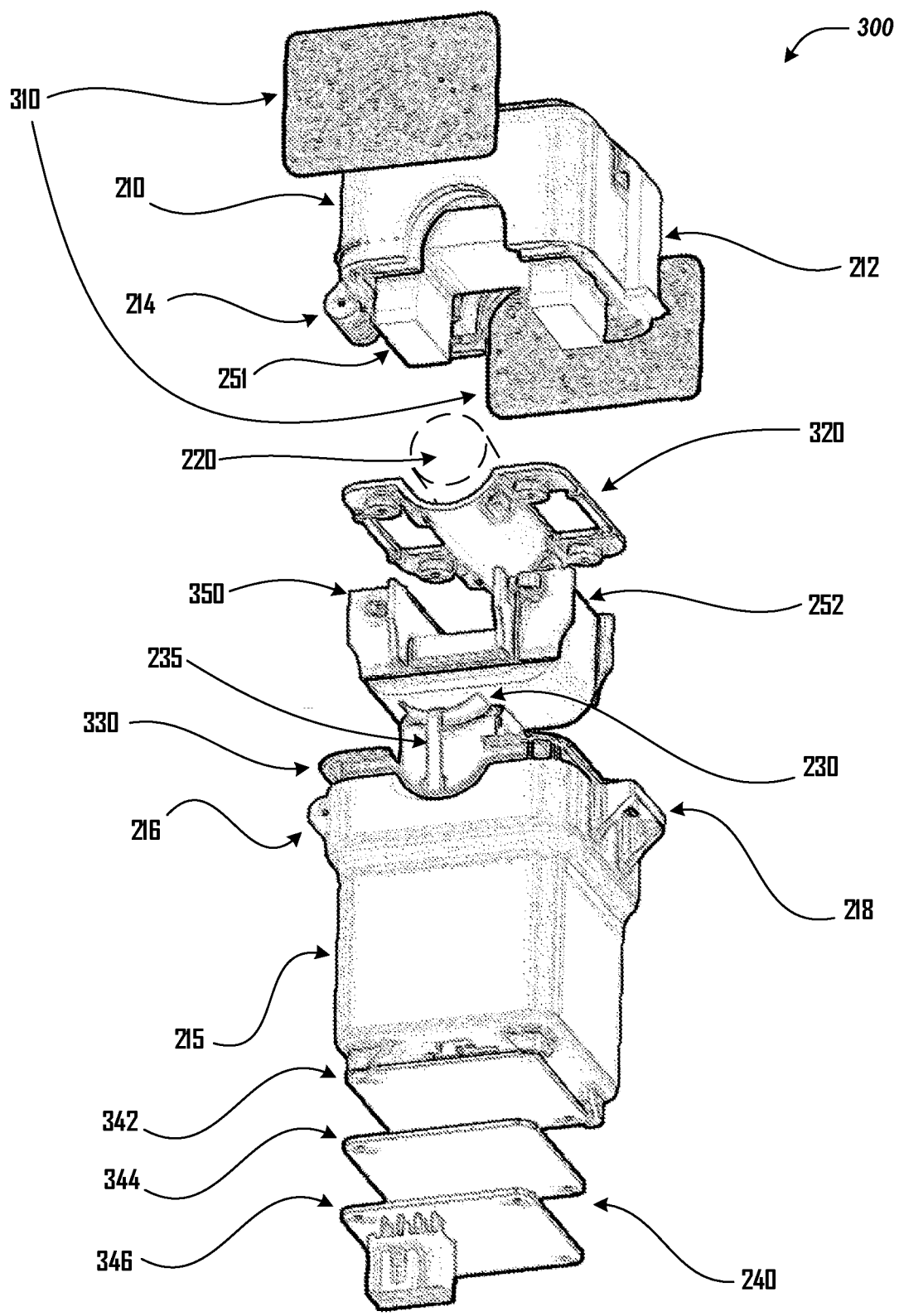
FIG. 3 illustrates a different exploded breakout view of components of an example non-contact voltage sensing apparatus in accordance with one embodiment.

FIG. 3 illustrates a different exploded breakout view of components of an example non-contact voltage sensing apparatus 300 in accordance with one embodiment. This illustration of an example non-contact voltage sensing apparatus 300 includes elements of the non-contact voltage sensing apparatus 200 of FIG. 2. For example, it includes the components of the housing: the upper housing 210 and the lower housing 215, the upper hinge part 214 and the lower hinge part 216, the hook 212 on the upper housing 210 that engages with the bar 218 on the lower housing 215. The example non-contact voltage sensing apparatus 300 also includes the measurement region 220, around which are situated the upper core 251 and the lower core 252 that form the core of the current transformer (the windings 253 are not shown in this illustration).

In this embodiment, resilient foam pieces 310 are configured to fit within the upper housing 210, on opposite sides of the current transformer upper core 251. The resilient foam pieces 310 provide a mechanical spring force to press a conductor in the measurement region 220 toward the conductive sense plate 230 when the non-contact voltage sensing apparatus 300 is assembled and closed around a conductor. In various embodiments, other mechanical means may be employed to fix or locate a conductor within the non-contact voltage sensing apparatus 300, e.g., a spring or a spring-loaded plate to provide a pushing force on a conductor, or a strap or clip to pull a conductor into a position.

The lower core 252 and an aligner 350 are shown, for illustrative purposes, out of the order in which they would be assembled in this example non-contact voltage sensing apparatus 300. In operation, the aligner 350 and lower core 252 would be located below the carrier 330 for the conductive sense plate 230. Similarly, for visibility the electronics 240 are shown broken out outside the lower housing 215.

In this embodiment, a separator 320 separates the measurement region 220 from the conductive sense plate 230, and in operation below it the carrier 330, the aligner 350, the current transformer lower core 252, and the electronics 240. The separator 320 is illustrated as a plastic piece having a thickness of approximately 1 mm In various embodiments, the separator 320 can be formed of various materials, be of various thicknesses, be of implicit construction (so that a space is provided between the measurement region 220 and the conductive sense plate 230) or be omitted (so that no space is provided between the measurement region 220 and the conductive sense plate 230).

In the illustrated embodiment, the conductive sense plate 230 is a conductive metal layer on a flexible printed circuit board ("PCB") with an insulating layer, e.g. polyamide. The connection 235 is made of the same material. The conductive sense plate 230 is shown configured with a curve or the flexibility to curve around a conductor in the measurement region 220 to improve capacitive coupling, e.g., by providing a reduced average distance between the conductive sense plate 230 and the conductor. A conductive sense plate 230 may also be flat (e.g., for simplicity of manufacture) or have a different shape.

In this example embodiment, the electronics 240 include three PCBs 342, 344, 346. In an implementation, each PCB may include circuitry to perform a discrete function or set of functions. For example, the electronics 240 may include a voltage sensing circuitry PCB 342, an energy harvesting and current sensing circuitry PCB 344, and a microcontroller and RF communication circuitry PCB 346. Another embodiment could integrate some or all of these functions onto a single PCB. Yet another embodiment could integrate some or all of these functions into an ASIC.

Figure 4:
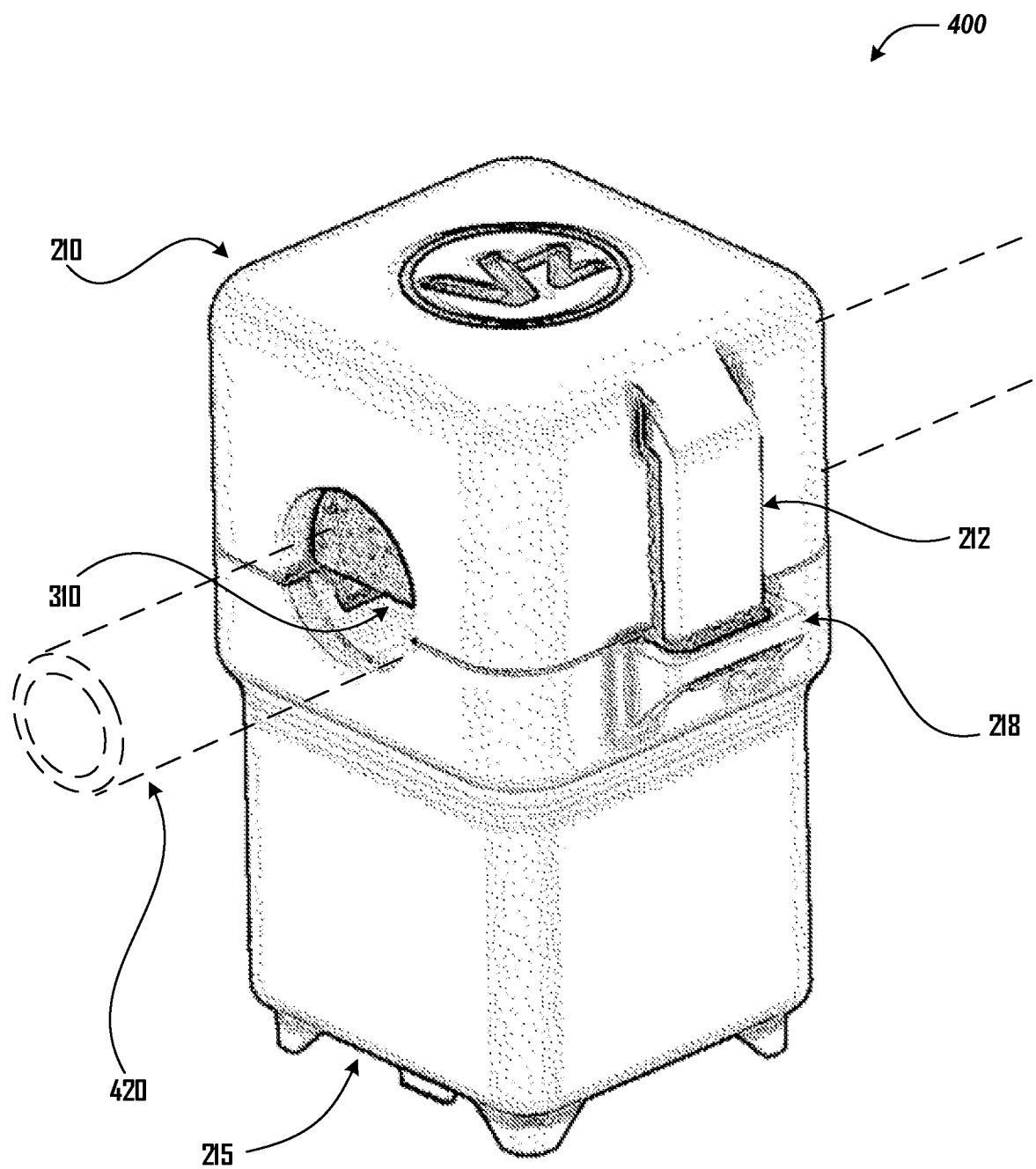
FIG. 4 illustrates a perspective view of an assembled example non-contact voltage sensing apparatus in accordance with one embodiment.

FIG. 4 illustrates a perspective view of an assembled example non-contact voltage sensing apparatus 400 in accordance with one embodiment. The upper housing 210 and the lower housing 215 of FIG. 2 are closed, and the hook 212 on the upper housing 210 is engaged with the bar 218 on the lower housing 215. This illustrates an elegant closure by which a person can simply press on the hook 212 to release it from the bar 218 and open the non-contact voltage sensing apparatus 400 (via the hinge, which is not visible) for placing the apparatus 400 onto, or removing it from, a conductor 420. The example non-contact voltage sensing apparatus 400 shows, by dashed line, a conductor 420 located in the measurement region of the apparatus 400, pressed into a position relative to the conductive sense plate by the mechanical spring force from the resilient foam pieces 310.

Figure 5:
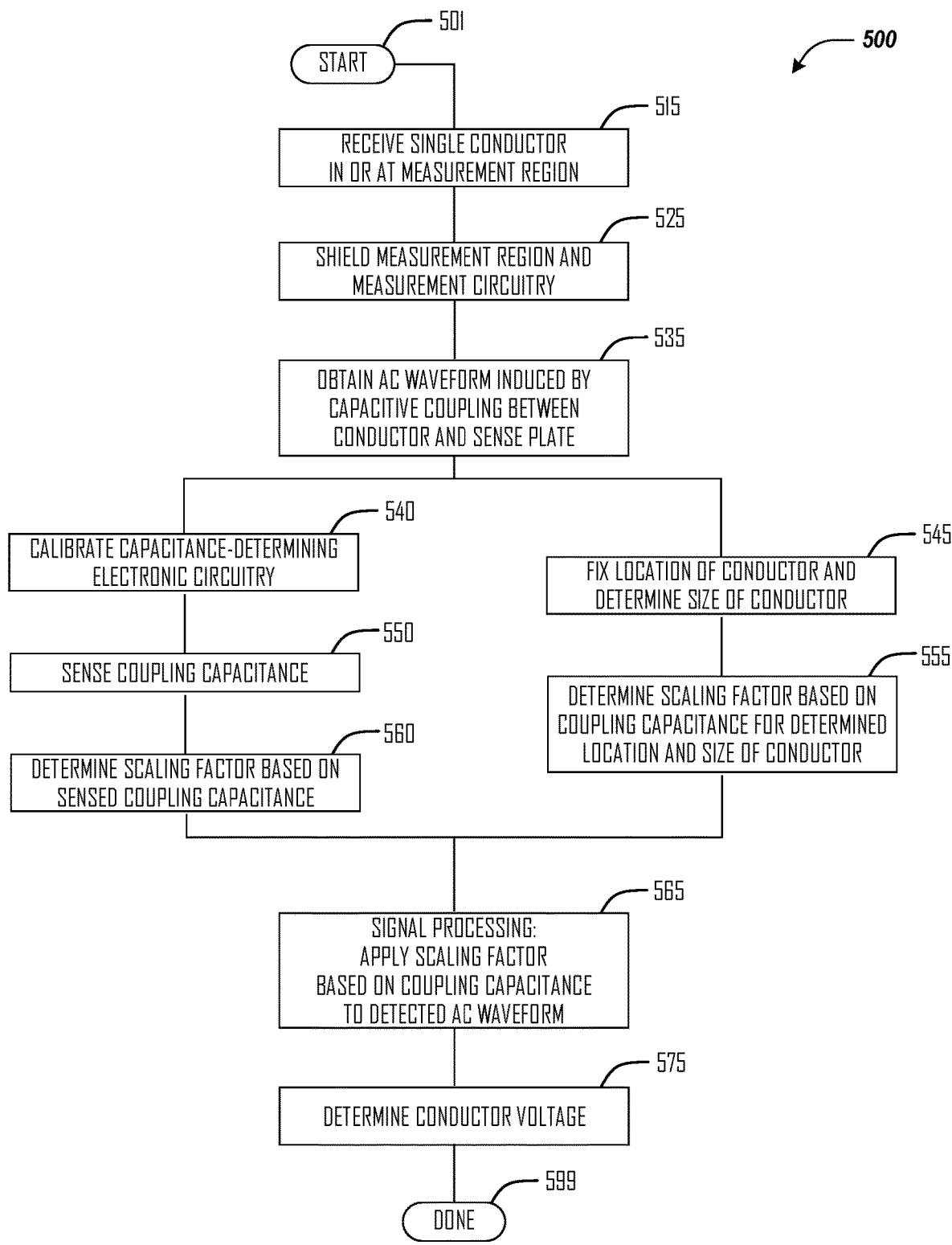
FIG. 5 illustrates an operational routine of a non-contact voltage sensing system in accordance with one embodiment.

FIG. 5 illustrates an operational routine 500 of a non-contact voltage sensing system in accordance with one embodiment. In various embodiments, the operational routine 500 is performed by one or more non-contact voltage sensing apparatuses such as those illustrated above with reference to FIGS. 1-4. Portions of the operational routine 500 may be performed by circuitry such as illustrated below with reference to FIGS. 6-9. As those having ordinary skill in the art will recognize, not all events of an operational routine are illustrated in FIG. 5. Rather, for clarity, only those aspects reasonably relevant to describing the non-contact sensing of an AC voltage are shown and described. Those having ordinary skill in the art will also recognize that the presented embodiment is merely one example embodiment and that variations on the presented embodiment may be made without departing from the scope of the broader inventive concept set forth in the description herein and the claims below. The operational routine 500 begins in starting block 501.

In block 515, the operational routine 500 receives a single AC conductor in or at a measurement region. As described above with reference to FIGS. 1 and 2, a measurement region for a conductor may be arranged so that the conductor passes along, into, or through the measurement region provided by the housing. The operational routine 500 receives a single AC conductor and excludes other conductors.

In block 525, the operational routine 500 shields some or all of the measurement region and/or the measurement circuitry or electronics. This allows the operational routine 500 to reduce interference from other conductors that may be nearby, and thus to improve the quality (e.g., precision and accuracy) of voltage measurement relative to a reference potential. For example, in a multiphase (e.g., three-phase) electrical system, conductors of alternate phases may produce unwanted capacitances to a conductive sense plate, as described below with reference to FIG. 12. In such an environment, arranging shielding to help isolate capacitance to the target conductor can enable the operational routine 500 to provide improved results.

In block 535, the operational routine 500 obtains an AC waveform by measuring a current induced via capacitive coupling between the energized conductor in the measurement region and a conductive sense plate of the non-contact voltage sensing apparatus. Example waveform-sensing electronic circuitry is described in further detail with reference to FIG. 7 below. The operational routine 500 may sample an AC waveform, though the sampled waveform may be a filtered and/or distorted representation of a voltage between the energized conductor and a reference potential.

The illustrated operational routine 500 branches to show two alternative approaches to determine a coupling capacitance and/or a scaling factor based on coupling capacitance. One branch includes blocks 540, 550, and 560; the other branch includes blocks 545 and 555. Various implementations of a non-contact voltage sensing system may utilize either approach, or combinations or permutations thereof.

Turning to the approach illustrated in blocks 540, 550, and 560: in some implementations, the routine 500 uses capacitance-determining electronic circuitry to measure a coupling capacitance between the energized conductor in the measurement region and the conductive sense plate of the non-contact voltage sensing apparatus. In block 540, the routine 500 calibrates the capacitance-determining electronic circuitry. Calibration may be performed under controlled conditions at the time of manufacture. Calibration may also be performed during operation, e.g., to correct for effects of parasitic capacitance. Example calibration circuitry is described in further detail with reference to FIG. 9 below.

In block 550, the operational routine 500 senses the coupling capacitance between the energized conductor and the conductive sense plate. For example, the routine 500 may determine the coupling capacitance using the capacitance-determining electronic circuitry calibrated in block 540. In some embodiments, the operational routine 500 produces a value for the coupling capacitance; in other embodiments, the operational routine 500 obtains an indication that does not directly provide a value for the coupling capacitance but may be used to produce a scaling factor for signal processing.

In block 560, the operational routine 500 determines a scaling factor based at least in part on the coupling capacitance between the conductor and the conductive sense plate of the non-contact voltage sensing apparatus. Example scaling factor- or capacitance-determining electronic circuitry is described in further detail with reference to FIG. 8 below.

Turning to the approach of blocks 545 and 555: in some implementations, the routine 500 measures a dimension of a conductive wire located in or at the measurement region. In block 545, the operational routine 500 fixes (or determines) the location of the conductor received in block 515 and determines a size of the conductor. To facilitate both physical measurement of the conductor and consistent electric measurement of voltage in the conductor, the routine 500 provides a mechanism for holding the conductor in a place or position. Some example mechanisms are described above with reference to FIG. 3 and below with reference to FIG. 11.

For example, a digital caliper may determine a width or diameter of a conductor including its insulating jacket. In other embodiments, an optical measuring system may determine a size of the conductor. In other embodiments, a measurement device may, e.g., obtain a circumferential measurement of a conductor, or use a shaped aperture (e.g., a vee shape or stepped opening) to locate a conductor according to its size. In some embodiments, the routine 500 determines a wire gauge or cross-sectional area of the conductor based on a measurement of the conductor. For example, the routine 500 may determine that a range of diameters of any conductive wire plus its insulating jacket corresponds to a particular gauge of wire. Thus, even though different brands of conductors may have different thicknesses of insulation and therefore overall diameters, the operational routine 500 can accurately determine a size of the conductive wire to provide an improved contactless determination of a voltage in the conductor.

In block 555, the operational routine 500 determines a scaling factor or coupling capacitance between the conductor and the conductive sense plate of the non-contact voltage sensing apparatus. In this approach, capacitance-determining electronic circuitry is configured to produce a scaling factor or estimated capacitance from a combination of fixed or known factors (e.g., the size of the conductive sense plate and distance from the conductive sense plate to the measurement region) and measured variables (e.g., the location and/or size of the target hot conductor). The operational routine 500 may determine the scaling factor or coupling capacitance based in part on the determination of the size of the conductor from block 545, so that the routine 500 accounts for how a gauge of the conductive wire affects the coupling capacitance.

For example, based on the geometry of the measurement space and location of the conductor relative to the conductive sense plate, together with the size of the conductor determined in block 545, the routine 500 can perform a calculation or use a lookup table to obtain a computed capacitance or scaling factor.

In block 565, the operational routine 500 performs signal processing with respect to the AC waveform obtained in block 535 and the scaling factor or coupling capacitance determined in block 560 or block 555. As described above with reference to FIG. 1, the routine 500 processes the obtained waveform representation and may recover a shape or frequency spectrum of the line voltage waveform. The operational routine 500 processes the coupling capacitance and/or the size of the conductor and may obtain a scaling factor. This may include multiple scaling factors, e.g., scaling factors that are frequency dependent and/or scaling factors that account for different influences on the obtained waveform representation. The operational routine 500 performs signal processing that scales the obtained waveform representation (e.g., the recovered shape or frequency spectrum of the line voltage waveform) based on the coupling capacitance (e.g., according to the scaling factor(s)).

In some implementations, the routine 500 applies one or more scaling factors to account for, e.g., nonlinearities in a circuit, attenuation at particular frequencies, or complex impedances, to separate out multiple correction factors that may affect measurement. In some implementations, calibration of a circuit may provide an additional scaling factor to account for parasitic capacitance.

In block 575, the operational routine 500 determines, based on the signal processing in block 565, an AC voltage of the conductor relative to a reference potential. The operational routine 500 is thus able to determine conductor voltage without interrupting the conductor, without contact to the conductor wire, and without reference to any other AC signal.

The operational routine 500 ends in ending block 599.

Alternative implementations of the operational routine 500 can perform routines having processes in a different order, and some processes or blocks can be deleted, moved, added, subdivided, combined, and/or modified to provide alternative or sub combinations. Each of these processes or blocks can be implemented in a variety of different ways. While some processes or blocks may be shown as being performed in series, they may instead be performed or implemented in parallel, or can be performed at different times.

Figure 6:
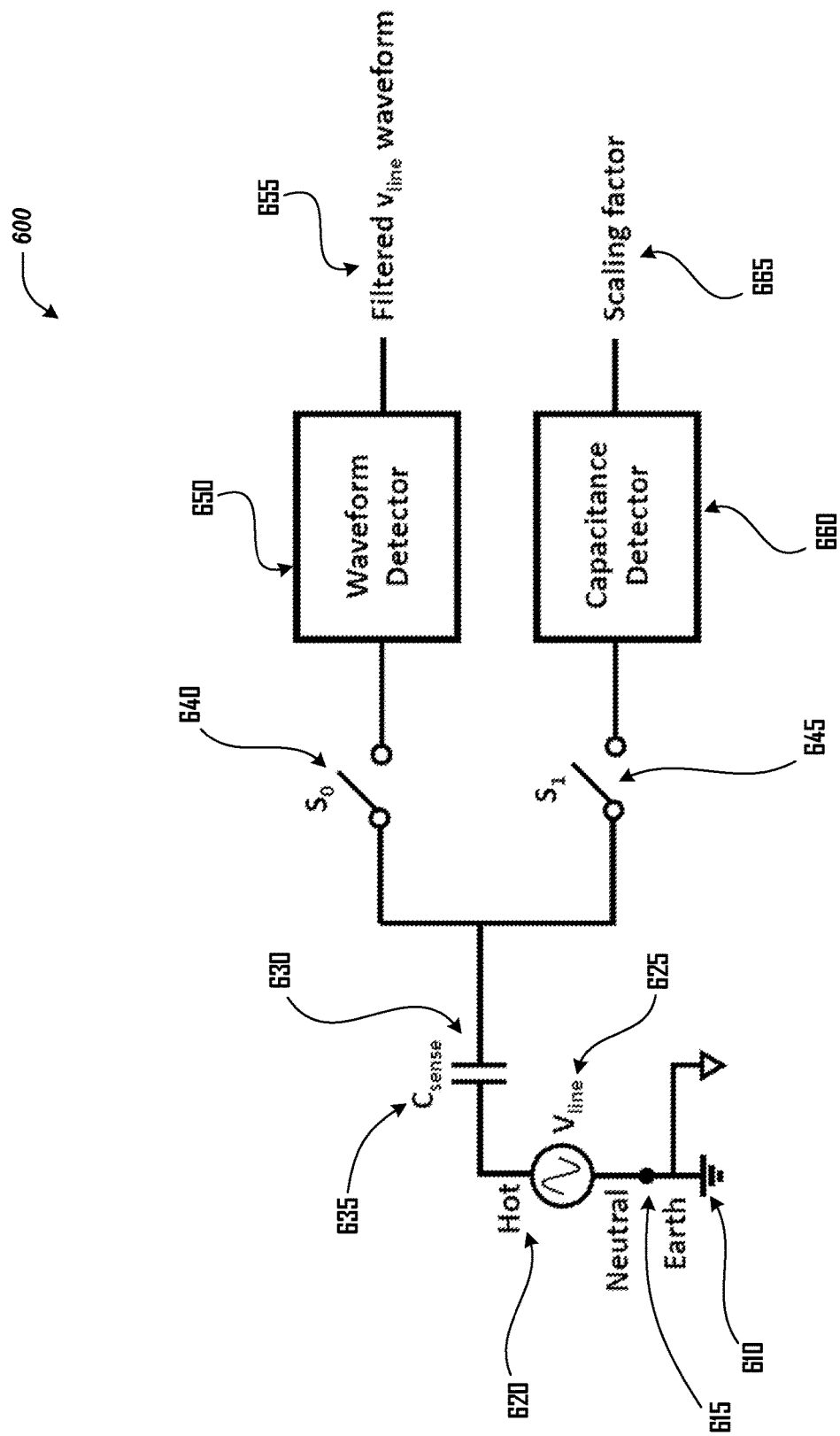
FIG. 6 is a wiring diagram schematically illustrating a multiplexing circuit of electrical components configured to measure a waveform and a capacitance in accordance with one embodiment.

FIG. 6 is a wiring diagram schematically illustrating a multiplexing circuit 600 of electrical components configured to measure a waveform and a capacitance in accordance with one embodiment. A hot conductor 620 carries an AC line current and voltage to be measured by a non-contact voltage sensing apparatus. The line voltage 625 in conductor 620 is labeled "$V_{line}$" in FIGS. 6-9. The hot conductor 620 is part of an electrical circuit that typically includes a load (not shown), a neutral 615 (e.g., a line, conductor, bus, or node), and a connection to earth 610.

The hot conductor 620 is capacitively coupled with a conductive sense plate 630. The capacitance 635 between the conductive sense plate 630 and the hot conductor 620 is labeled "$C_{sense}$" in FIGS. 6-9 and 12. In various embodiments, the conductive sense plate 630 may comprise one or more components of a capacitor such as the conductive sense plate 130 described above with reference to FIG. 1 or the conductive sense plate 230 described above with reference to FIGS. 2-3.

The conductive sense plate 630 may be switchably connectable to a waveform detector 650 (e.g., waveform-sensing electronic circuitry such as described in further detail with reference to FIG. 7 below) via switch $S_0$ 640, and/or to a capacitance detector 660 (e.g., capacitance-determining electronic circuitry such as described in further detail with reference to FIG. 8 below) via switch $S_1$ 645. In some embodiments, switches $S_0$ 640 and $S_1$ 645 are physically connected or logically controlled so that when switch $S_0$ 640 is closed, switch $S_1$ 645 is open, and/or vice versa. For example, switch $S_0$ 640 and switch $S_1$ 645 can be implemented as one single-pole double-throw ("SPDT") switch. In such embodiments, the conductive sense plate 630 is switched between the waveform detector 650 and the capacitance detector 660 so that the conductive sense plate 630 is connected to either the waveform detector 650 or the capacitance detector 660 but not to both at the same time.

In some embodiments, switches $S_0$ 640 and $S_1$ 645 can be switched independently, e.g., allowing both to be in an open state so that the conductive sense plate 630 is connected to neither the waveform detector 650 nor the capacitance detector 660. In some embodiments, switches $S_0$ 640 and $S_1$ 645 can be switched such that both are in a closed state so that the conductive sense plate 630 is connected to both the waveform detector 650 and the capacitance detector 660 at the same time. In some embodiments, the switches $S_0$ 640 and $S_1$ 645 are connected to separate conductive sense plates 630, such that the waveform detector 650 is switchably connected to one conductive sense plate 630 and the capacitance detector 660 is switchably connected to another conductive sense plate 630.

In an embodiment in which the conductive sense plate 630 is configured to be switchable between the waveform detector 650 and the capacitance detector 660, the switches $S_0$ 640 and $S_1$ 645 may be operated in two or more phases. For example, in one phase, switch $S_0$ 640 may be closed, and switch $S_1$ 645 may be open, so that the waveform detector 650 can amplify and sample a filtered $V_{line}$ waveform "$V_{sense}$" 655 of voltage in the hot conductor 620. In another phase, switch $S_0$ 640 may be open, and switch $S_1$ 645 may be closed, so that the capacitance detector 660 can measure capacitance $C_{sense}$ 635 of the conductive sense plate 630 to obtain a scaling factor 665 for scaling the filtered $V_{line}$ waveform "$V_{sense}$" 655.

Accordingly, by controlling the switches $S_0$ 640 and/or $S_1$ 645, a multiplexing circuit 600 of a non-contact voltage sensing apparatus according to the present disclosure can selectively couple a conductive sense plate 630 to a waveform detector 650 and/or a capacitance detector 660. By multiplexing the conductive sense plate 630 between the waveform detector 650 and the capacitance detector 660, the same conductive sense plate 630 used by the waveform detector 650 can be shared with the capacitance detector 660 for accurate measurement and signal processing. In addition, the multiplexing allows duplication of components to be minimized.

Figure 7:
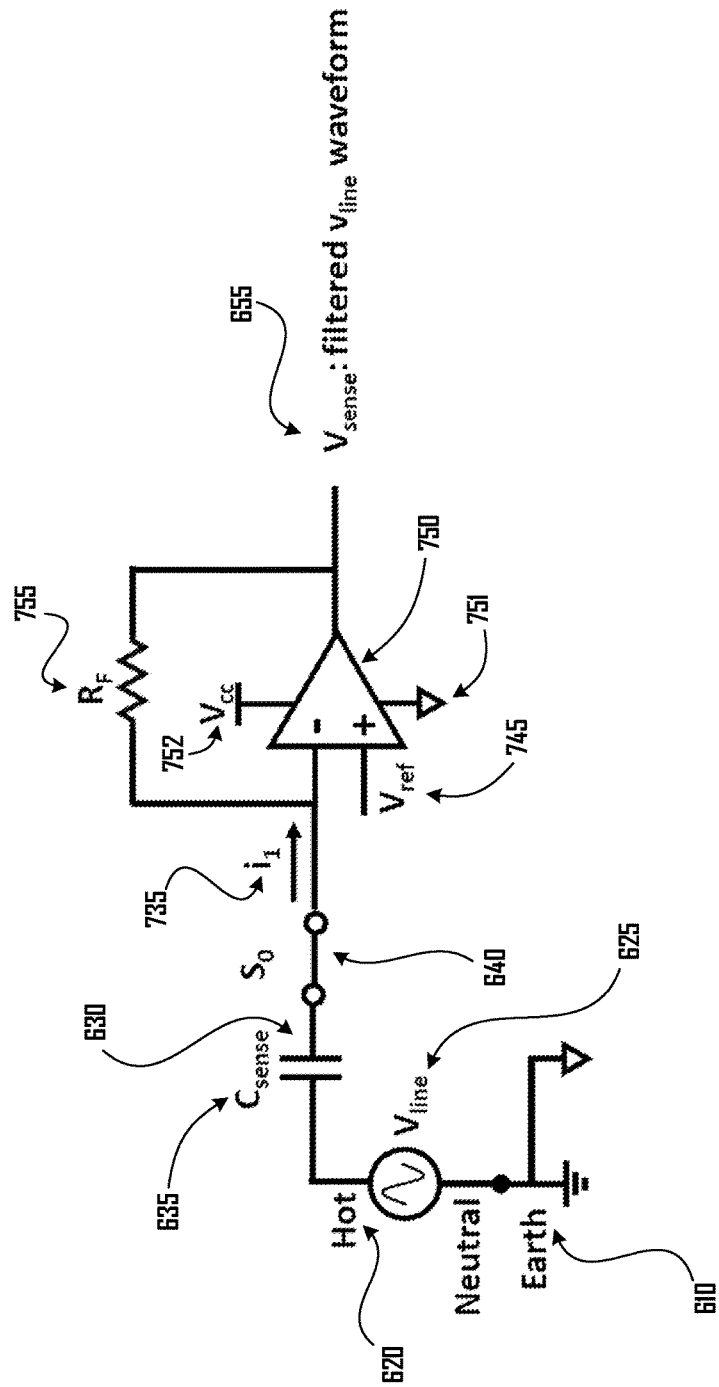
FIG. 7 is a wiring diagram schematically illustrating electrical components of a waveform detector circuit in accordance with one embodiment.

FIG. 7 is a wiring diagram schematically illustrating electrical components of a waveform detector circuit 700 in accordance with one embodiment. The waveform detector circuit 700 includes the hot conductor 620 with voltage $V_{line}$ 625, earth 610 (reference voltage), conductive sense plate 630 with capacitance $C_{sense}$ 635, and switch $S_0$ 640 in a closed position, as described in further detail above with reference to FIG. 6. The illustrated waveform detector circuit 700 is configured to convert an induced current "$i_1$" 735 into an amplified voltage signal proportional to the hot conductor 620 voltage $V_{line}$ 625. The time-varying AC voltage 625 of the hot conductor 620 induces, through capacitive coupling, the induced current $i_1$ 735, so that the waveform detector circuit 700 produces a filtered or distorted $V_{line}$ waveform output "$V_{sense}$" 655.

In the illustrated embodiment, the waveform detector circuit 700 is implemented as a transimpedance amplifier circuit. Those having ordinary skill in the art will recognize that alternative implementations, e.g., other means of current measurement that may include different current-to-voltage circuitry or other current-sensing circuitry, may equivalently be used to sense the induced current $i_1$ 735.

The illustrated waveform detector circuit 700 includes an amplifier 750, e.g., an op-amp. At one input of the amplifier 750, a constant DC reference voltage "$V_{ref}$" 745 may be used to properly bias the waveform detector circuit 700. At another input of the amplifier 750, the induced current $i_1$ 735 is combined with a feedback loop connected to the output $V_{sense}$ 655. The feedback loop resistance "$R_f$" 755 may be chosen to provide a gain for the amplifier 750. The amplifier 750 is also connected to a DC supply voltage $V_{CC}$ 752 and a sensor ground 751.

The illustrated waveform detector circuit 700 produces an output signal $V_{sense}$ 655 that scales linearly with the coupling capacitance $C_{sense}$ 635 and with the voltage $V_{line}$ 625 in the hot conductor 620. For example, the illustrated circuit may determine the output $V_{sense}$ 655 as follows, based on the time-varying voltage $V_{line}$ 625 in the hot conductor 620, the coupling capacitance $C_{sense}$ 635 between the conductive sense plate 630 and the hot conductor 620, the induced current $i_1$ 735, and the feedback loop resistance $R_f$ 755:

$$i_1(t) = C_{sense}\frac{dv_{line}(t)}{dt}$$

$$v_{sense}(t) = -i_1(t)R_F$$

$$v_{sense}(t) = -R_F C_{sense}\frac{dv_{line}(t)}{dt}$$

$$v_{line}(t) = -\frac{1}{R_F C_{sense}}\int v_{sense}(t)dt$$

Integrating the determined output $V_{sense}$ 655, the waveform detector circuit 700 or signal processing circuitry produces a response proportional to the time-varying AC line voltage $V_{line}$ 625.

Thus, if the coupling capacitance $C_{sense}$ 635 can be known, the output $V_{sense}$ 655 of the waveform detector circuit 700 can be used by a non-contact voltage sensing apparatus according to the present disclosure to measure the AC line voltage $V_{line}$ 625 in the hot conductor 620.

Figure 8:
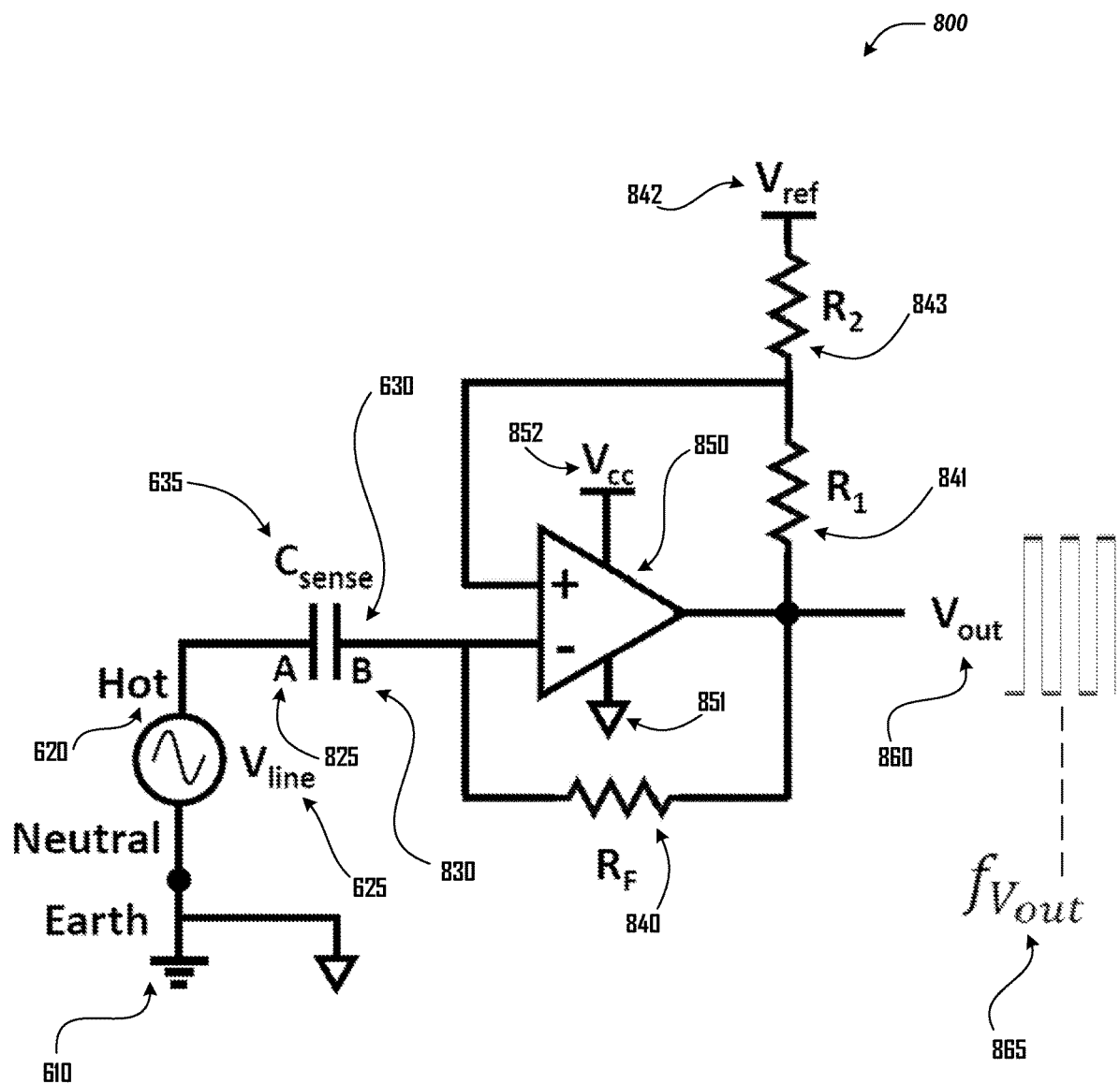
FIG. 8 is a wiring diagram schematically illustrating electrical components of a capacitance detector circuit in accordance with one embodiment.

FIG. 8 is a wiring diagram schematically illustrating electrical components of a capacitance detector circuit 800 (or capacitance-determining electronic circuitry) in accordance with one embodiment. The capacitance detector circuit 800 includes the hot conductor 620 with voltage $V_{line}$ 625, earth 610 (reference voltage), and conductive sense plate 630 with capacitance $C_{sense}$ 635, as described in further detail above with reference to FIG. 6. The illustrated capacitance detector circuit 800 includes node A 825 and node B 830 to illustrate the formation of capacitance $C_{sense}$ 635 in the conductive sense plate 630. In the illustrated embodiment, the metallic wire of the energized hot conductor 820 forms node A, and a conductive sense plate (e.g., the conductive sense plate 130 described above with reference to FIG. 1 or the conductive sense plate 230 described above with reference to FIGS. 2-3) forms node B. The capacitance $C_{sense}$ 635 is dependent on physical characteristics of node A 825 and node B 830, such as, e.g., a size (e.g., wire gauge) of the node A 825 hot conductor 820 and an area and/or shape of the node B 830 conductive sense plate. The capacitance $C_{sense}$ 635 is also dependent on a geometry of a relationship between node A 825 and node B 830, such as, e.g., alignment and distance between node A 825 and node B 830. Such factors may differ with each installation or application of a non-contact voltage sensing apparatus according to the present disclosure. Therefore, a capacitance detector circuit 800 allows more accurate determination of the voltage $V_{line}$ 625 in the hot conductor 620.

The illustrated capacitance detector circuit 800 includes a relaxation oscillator configured to generate a signal having a frequency proportional to the capacitance $C_{sense}$ 635 between the hot conductor 620 and the conductive sense plate 630. The conductive sense plate 630 is discharged by current flow in the following loop: node B 830, sensor ground 851, earth 610, neutral, node A 825. The conductive sense plate 630 is charged by current flow in the following loop: node B 830, $V_{CC}$ 852, sensor ground 851, earth 610, neutral, node A 825. The capacitance detector circuit 800 produces a voltage output "$V_{out}$" 860 that switches at a switching frequency $fv_{out}$ 865. The switching frequency $fv_{out}$ 865 of the capacitance detector circuit 800 output $V_{out}$ 860 can provide a scaling factor 665 for scaling the filtered $V_{line}$ waveform output $V_{sense}$ 655 from the waveform detector circuit 700.

In the illustrated embodiment, the capacitance detector circuit 800 is implemented as an astable multivibrator circuit. Those having ordinary skill in the art will recognize that alternative implementations, e.g., other means of capacitance measurement that may include different relaxation oscillator or capacitance-to-frequency circuitry or other capacitance-sensing circuitry, may equivalently be used to sense the capacitance $C_{sense}$ 635. The illustrated relaxation oscillator circuit allows a non-contact voltage sensing apparatus in accordance with this disclosure to synthesize a transfer function to easily recover the $V_{line}$ waveform from the filtered $V_{sense}$ 655, at a low power expenditure.

The illustrated capacitance detector circuit 800 is astable and continuously switches its output $V_{out}$ 860 between $V_{CC}$ 852 and the sensor ground 851 potential (e.g., connected to earth 610 or another reference potential). The astable multivibrator circuit includes an op-amp 850, a feedback resistance $R_f$ 840, a constant DC reference voltage $V_{ref}$ 842, and resistances $R_1$ 841 and $R_2$ 842. Its output $V_{out}$ 860 switching frequency $fv_{out}$ 865 depends on a time constant set by feedback resistance $R_f$ 840 and the coupling capacitance $C_{sense}$ 635 formed between the hot conductor 620 and the conductive sense plate 630. For example, the switching frequency $fv_{out}$ 865 of the illustrated circuit 800 is inversely proportional to $C_{sense}$ 635. Accordingly, the capacitance detector circuit 800 may determine the switching frequency $fv_{out}$ 865 as follows:

$$\beta = \frac{R_2}{R_1 + R_2}$$

$$T_{V_{out}} = 2R_F C_{sense} \ln\left(\frac{1+\beta}{1-\beta}\right)$$

$$f_{V_{out}} = \frac{1}{T_{V_{out}}}$$

Signal processing electronic circuitry may be configured to use the output frequency $fv_{out}$ 865 of the coupling capacitance-determining electronic circuitry 800 to obtain a determination of the capacitance $C_{sense}$ 635 and apply that determination to scale the filtered $V_{line}$ waveform output $V_{sense}$ 655 produced by the waveform detector circuit 700, which depends on the capacitance $C_{sense}$ 635.

Figure 9:
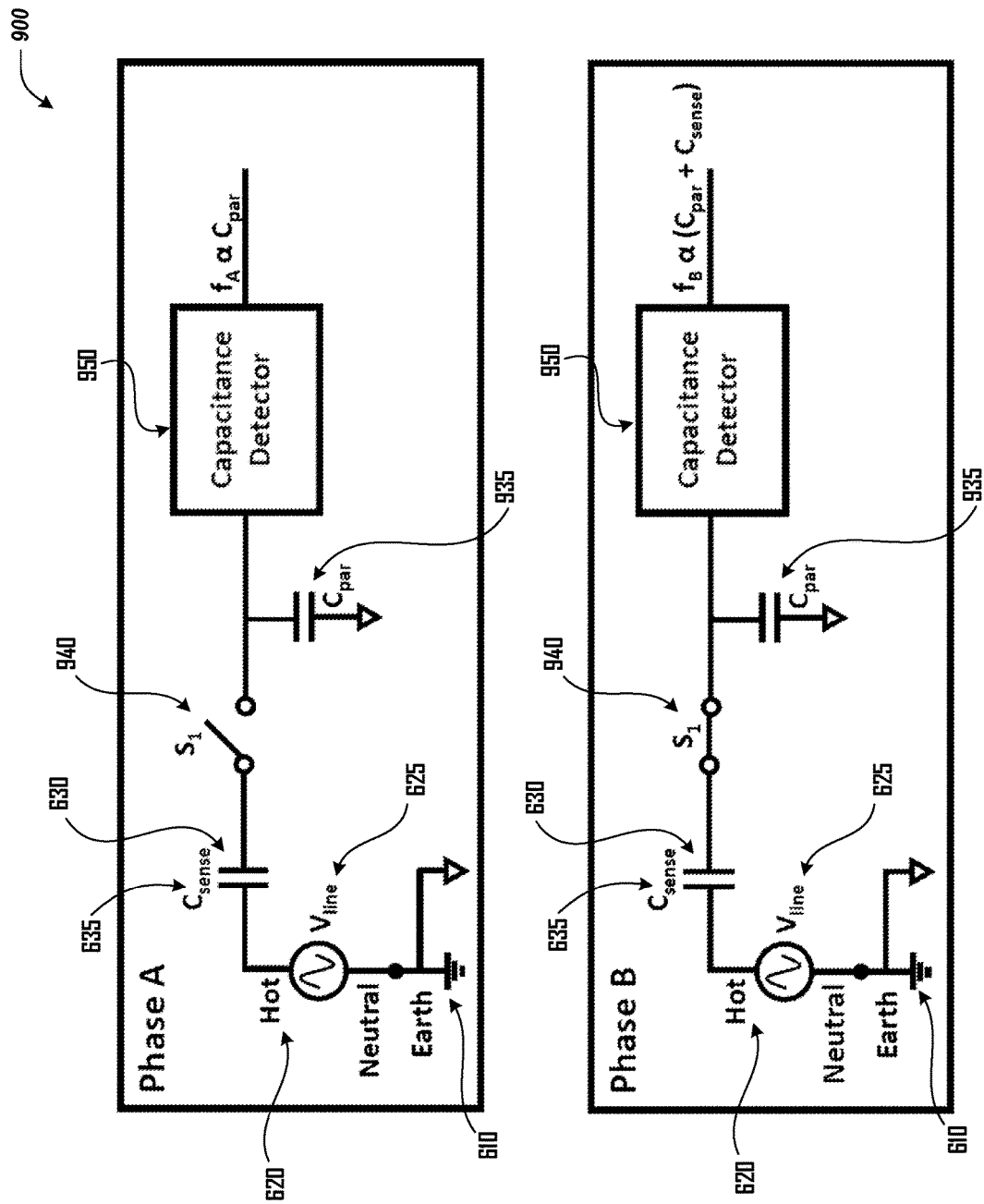
FIG. 9 is a wiring diagram schematically illustrating electrical components of a calibration circuit configured to calibrate a capacitance detector circuit in accordance with one embodiment.

FIG. 9 is a wiring diagram schematically illustrating electrical components of a calibration circuit 900 configured to calibrate a capacitance detector circuit in accordance with one embodiment. In the illustrated embodiment, the calibration circuit 900 includes a capacitance detector 950 that can be calibrated to more accurately measure a capacitance, e.g., the capacitance $C_{sense}$ 635. For example, the capacitance detector 950 may include a portion or all of the capacitance detector circuit 800 described above with reference to FIG. 8 (e.g., a relaxation oscillator).

It also includes two capacitive elements: a fixed, known, or background (e.g., parasitic [possibly unknown and/or changing]) capacitance $C_{par}$ 935 between a ground or reference potential and the capacitance detector 950, and the possibly variable or unknown coupling capacitance $C_{sense}$ 635 formed between the hot conductor 620 and the conductive sense plate 630. The calibration circuit 900 also includes a calibration phase switch "$S_1$" 940. The illustrated calibration circuit 900 is configured to operate in two phases to calibrate the capacitance detector 950.

In Phase A, the calibration phase switch $S_1$ 940 is open, and the capacitance detector 950 is only influenced by the capacitance $C_{par}$ 935. In Phase A, the capacitance detector 950 is isolated from the coupling capacitance $C_{sense}$ 635. Accordingly, the output (e.g., frequency) of the capacitance detector 950 in Phase A is proportional to the capacitance $C_{par}$ 935.

In Phase B, the calibration phase switch "$S_1$" 940 is closed, so that the coupling capacitance $C_{sense}$ 635 is also connected into the circuit including the capacitance $C_{par}$ 935 and the capacitance detector 950. Accordingly, the output (e.g., frequency) of the capacitance detector 950 in Phase B is proportional to both the capacitance $C_{par}$ 935 and the coupling capacitance $C_{sense}$ 635. In the illustrated embodiment, the frequency of the capacitance detector 950 in Phase B is proportional to the sum of capacitance $C_{par}$ 935 and coupling capacitance $C_{sense}$ 635.

By comparing the output of the capacitance detector 950 in Phase A with the output of the capacitance detector 950 in Phase B, the calibration circuit 900 (or, e.g., signal processing circuitry and/or control circuitry) can obtain a more accurate determination of the coupling capacitance $C_{sense}$ 635. For example, in the illustrated embodiment, calibration may include taking a difference between two frequencies: $C_{sense}$ α $(f_B - f_A)$.

The calibration circuit 900 provides a way to dynamically correct for the effect of any parasitic capacitance $C_{par}$ 935, and/or to calibrate a capacitance detector 950. In other implementations, such a correction may be performed by a different type of calibration circuit, e.g., calibration via controlled conditions at manufacturing.

Figure 10A:
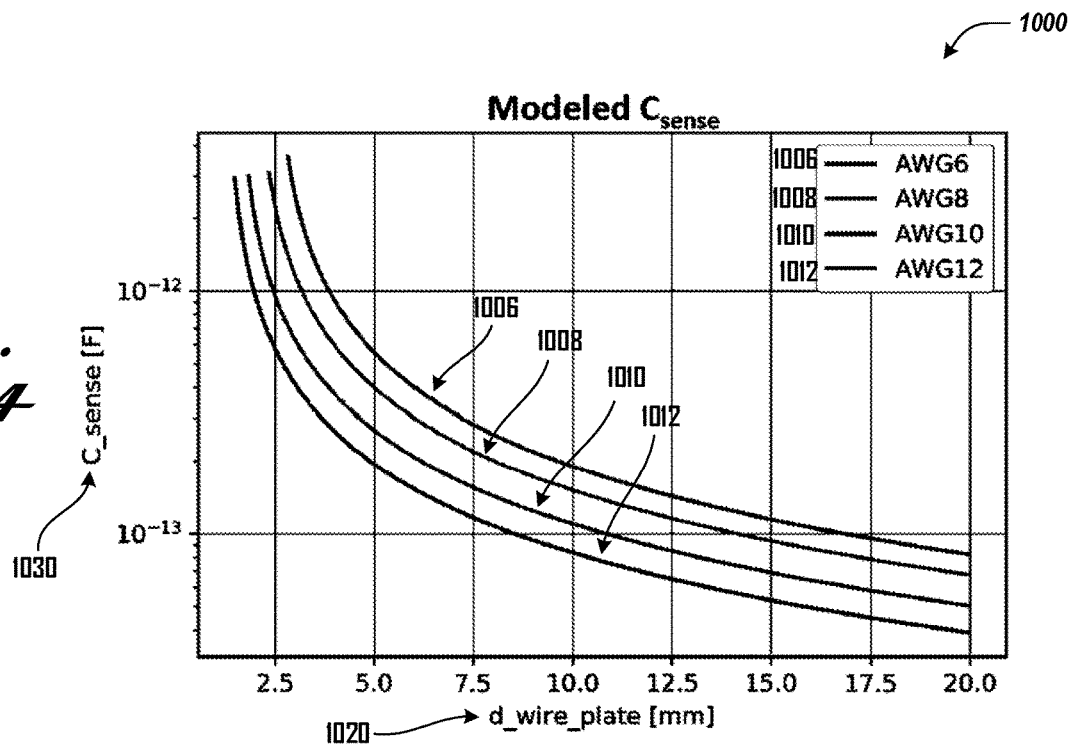
FIGS. 10A-10B are graphs illustrating a sensitivity of sensed capacitance to conductor size and distance from a conductive sense plate.
Figure 10B:
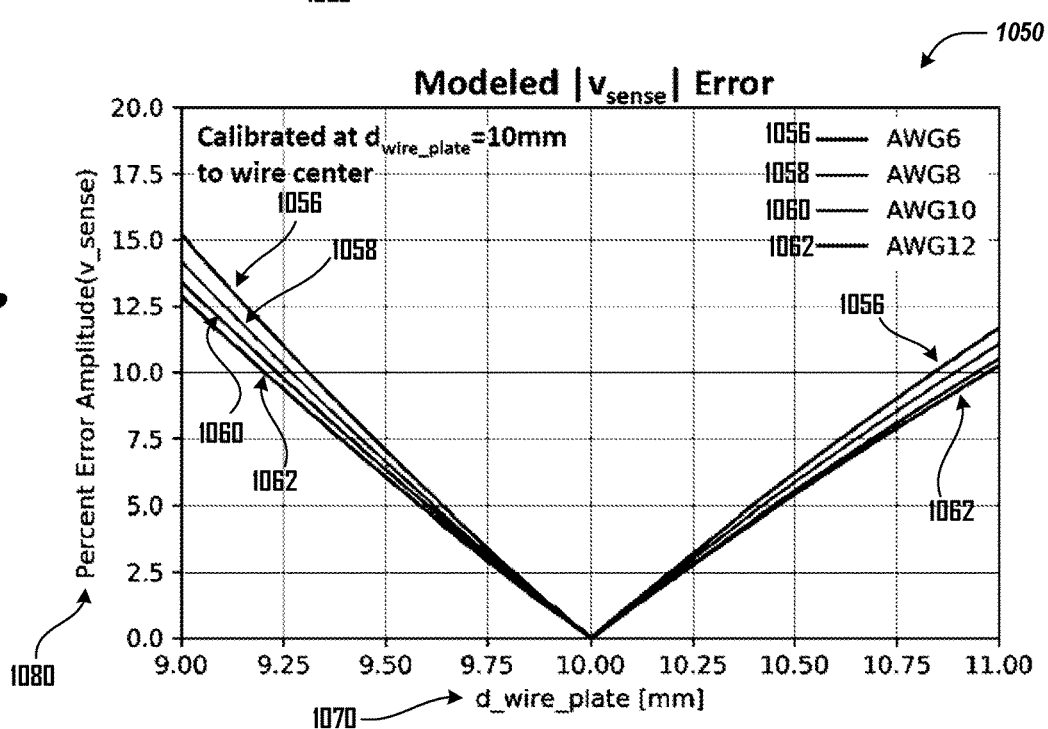

FIGS. 10A-10B are graphs illustrating a sensitivity of sensed capacitance to conductor size and distance from a conductive sense plate, for a given dielectric constant.

FIG. 10A illustrates a graph 1000 showing a modeled relationship between distance and capacitance $C_{sense}$ for wires of different gauges. The x-axis of graph 1000 displays a distance "d_wire_plate" 1020 between a conductive sense plate and a conductive wire, measured in millimeters (ranging linearly from approximately 1 mm to 20 mm in divisions of 2.5 mm) The y-axis of graph 1000 displays a capacitance "C_sense" 1030, measured in Farads (ranging from approximately $10^{-14}$ to $10^{-11}$ Farads, in a logarithmic or other non-linear scale). Capacitance-versus-distance curves are plotted for four wires of different sizes: 6-gauge (AWG6) wire 1006, 8-gauge (AWG8) wire 1008, 10-gauge (AWG10) wire 1010, and 12-gauge (AWG12) wire 1012. For a given wire, capacitance is greater for a smaller distance. For a given distance between the sense plate and wire, capacitance is greater for larger wire.

FIG. 10B illustrates a graph 1050 showing a modeled relationship between wire positioning error and percent absolute error of measuring voltage $V_{sense}$ in wires of different gauges. The x-axis of graph 1050 displays a distance "d_wire_plate" 1070 between a conductive sense plate and a conductive wire, measured in millimeters (ranging linearly from approximately 9 mm to 11 mm in divisions of 0.25 mm) The y-axis of graph 1050 displays a "Percent Error Amplitude(V_sense)" 1080, measured in percentages (ranging linearly from 0 to 20 percent). Error-versus-distance curves are plotted for four wires of different sizes: 6-gauge (AWG6) wire 1056, 8-gauge (AWG8) wire 1058, 10-gauge (AWG10) wire 1060, and 12-gauge (AWG12) wire 1062. The curves are all calibrated for a target 10-millimeter distance from the conductive sense plate to the center of the wire, so all of the curves show no error where d_wire_plate is exactly 10 mm. For a given wire, as actual distance to the sense plate diverges in either direction from the calibrated distance, the absolute value of the error percentage grows larger. For a given distance between the sense plate and wire, percentage error is greater for larger wire.

FIG. 11 illustrates physical components of an example conductor fixing and measurement system 1100 including a digital caliper in accordance with one embodiment. A conductor fixing and measurement system 1100 may improve measurement of a capacitance $C_{sense}$ and reduce error in determining an AC voltage $V_{sense}$ (e.g., as illustrated above with reference to FIGS. 10A-10B), for example by enabling a non-contact voltage sensing apparatus to determine and/or account for a location of the conductor to be measured and a size of the conductor to be measured.

In some embodiments, the non-contact voltage sensing apparatus of the present disclosure includes conductor measurement means to fix and/or measure one or more aspects of a conductor at a measurement region. For example, the apparatus may include one or more features configured to guide a conductor to the measurement region (e.g., to a location and/or into an orientation at the measurement region) and/or to hold the conductor at or in the measurement region. In some embodiments, the apparatus is configured to fix at least a portion of a conductor in or against a known position.

The apparatus may include one or more features to obtain a determination of at least one physical dimension of the conductor. For example, the apparatus may be configured to determine a diameter of a conductor (e.g., a wire including an outer insulating jacket/layer), a circumference of the conductor (e.g., a partial circumference), a wire gauge of the conductor, and/or a cross-sectional area of the conductor.

In the illustrated example, a conductor fixing and measurement system 1100 includes a digital caliper. The system 1100 includes an upper housing 1110 and a lower housing 1115 connected by a hinge 1116. The upper housing 1110 and lower housing 1115 close around a measurement region 1120 configured to receive a conductor 1122. The conductor 1122 is pressed between a fixed caliper jaw 1130 within the lower housing 1115 and a movable caliper jaw 1140 (e.g., slidable) within the upper housing 1110. The movable caliper jaw 1140 is connected to a pair of guide rails 1145 that can move within rail receivers 1140 in the upper housing 1110, allowing the movable caliper jaw 1140 to adjust to accommodate different sizes of conductor 1122. A tension leaf spring 1160 or other resilient element provides spring force to move or press the movable caliper jaw 1140 against the conductor 1122.

In operation, the conductor fixing and measurement system 1100 includes a sliding measure 1170 (e.g., attached to or part of a guide rail 1145) that indicates, by the location of the movable caliper jaw 1140, the size (e.g., diameter) of the conductor 1122. For example, the sliding measure 1170 may include conductive, capacitive, resistive, magnetic, and/or optical elements readable by an electrical contact, magnetic head, or optical reader 1180. For example, the sliding measure 1170 may include a PCB with metallic fingers at a periodic spacing, and the reader 1180 may include a conductive sense electrode and/or capacitance detector circuit (e.g., on another PCB). When the measure 1170 PCB moves with respect to the reader 1180, the capacitance changes periodically as the conductive fingers (e.g., triangles) of the sliding measure 1170 slide past the reader 1180. A microcontroller can count the periodic changes in capacitance corresponding to the changing positioning of the sliding measure 1170 attached to the movable caliper jaw 1140. Thus, based on the known finger spacing and the count of capacitance changes, the microcontroller may determine an absolute positioning of the movable caliper jaw 1140 with respect to the reader 1180. This allows precise measurement of the diameter of the conductor 1122. In some embodiments, the conductor fixing and measurement system 1100 includes an absolute positioning identification system (e.g., a binary code reader) that incorporates mechanical, electromagnetic, and/or optical position coding.

From the total diameter of the conductor 1122 (including approximately twice the thickness of its insulating jacket), the microcontroller can calculate a probable wire gauge and probable insulation thickness. For example, known insulation and/or wire gauge standards may enable the conductor fixing and measurement system 1100 to categorize the conductor into one of a set of discrete categories, e.g., if a thickest 6-gauge wire is smaller than a thinnest 4-gauge wire. Based on those calculations, the conductor fixing and measurement system 1100 can estimate a distance between the center of the wire and the conductive sense plate.

A non-contact voltage sensing apparatus may include a conductor fixing and measurement system 1100 or a functional equivalent to improve the accuracy of determining a coupling capacitance between a target conductor and a conductive sense plate, so that the apparatus provides a more accurate determination of an AC voltage in the target conductor.

Figure 12:
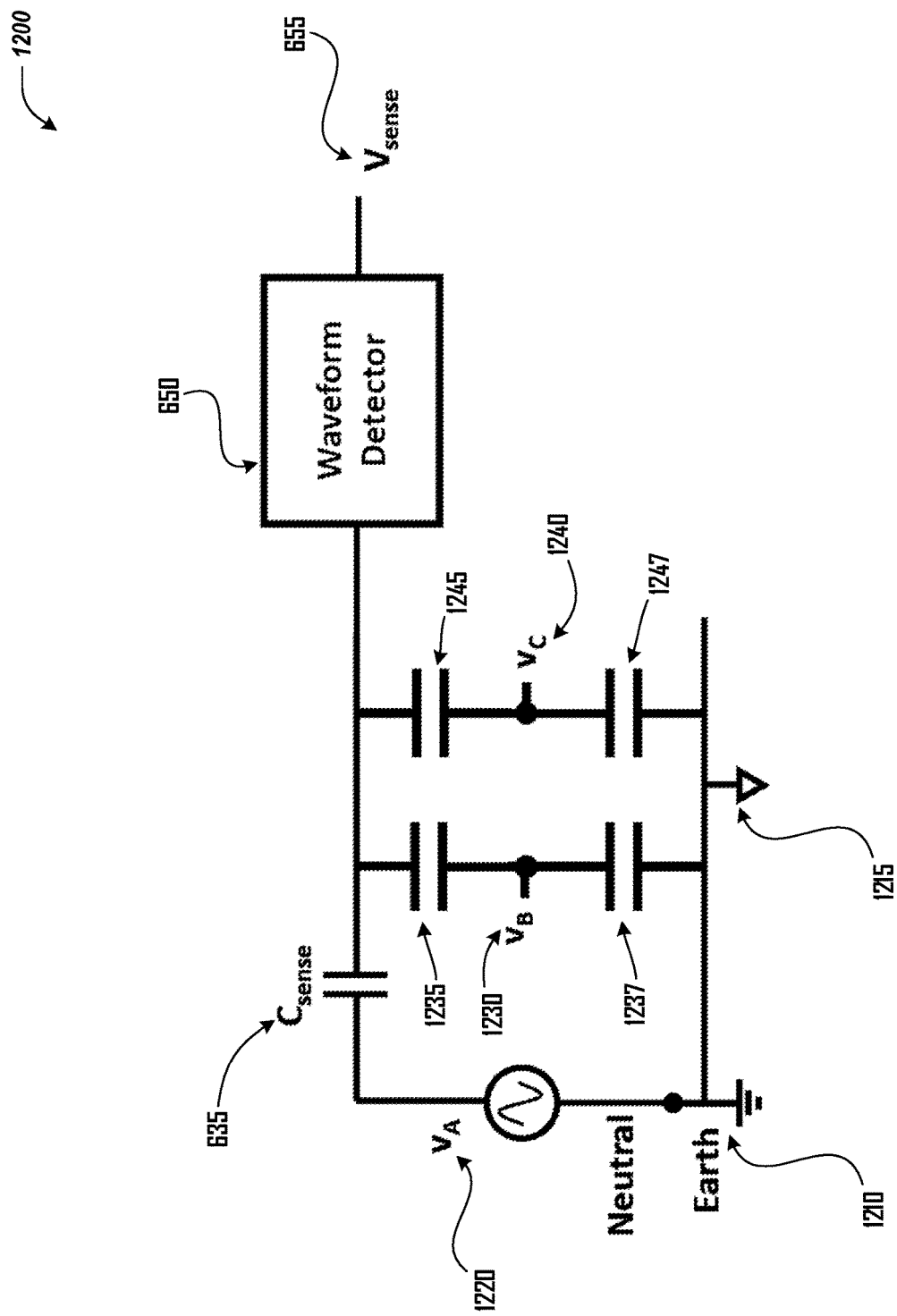
FIG. 12 is a wiring diagram schematically illustrating multiphase coupling capacitances.

FIG. 12 is a wiring diagram 1200 schematically illustrating multiphase coupling capacitances. Conventionally, shielding (such as shield 125 described above with reference to FIG. 1) has not been considered necessary in measuring an AC circuit. The inventors have discovered, however, that shielding can be surprisingly important for non-contact voltage sensing in multiphase (e.g., three-phase) environments.

For example, without shielding, a current can undesirably be injected into a waveform detector 650 from an energized non-target AC voltage phase. The wiring diagram 1200 schematically illustrates an example multiphase environment in which the waveform detector 650 is intended to measure the voltage on a first conductor VA 1220 with respect to a ground 1210 potential. The multiphase environment includes additional conductors $V_B$ 1230 and $V_C$ 1240 energized with AC voltages of different phases. As a result, the waveform measured by waveform detector 650 may be corrupted by capacitances 1235, 1245 between the waveform detector 650 and conductors $V_B$ 1230 and $V_C$ 1240, and potentially capacitances 1237, 1247 between the sensor ground 1215 potential and conductors $V_B$ 1230 and $V_C$ 1240. As a result of the currents injected from these non-target phases, the output $V_{sense}$ 655 may be incorrect. Therefore, the disclosed non-contact voltage sensing apparatus is shielded to reduce the influence of undesired capacitances as described above.

Although specific embodiments have been illustrated and described herein, it will be appreciated by those of ordinary skill in the art that alternate and/or equivalent implementations may be substituted for the specific embodiments shown and described without departing from the scope of the present disclosure. For example, although various embodiments are described above in terms of a housing that snaps around a conductor, in other embodiments various other form factors may be used. In addition, processing and/or output readings may be provided locally at the apparatus and/or performed or displayed remotely. The spirit and scope of this application is intended to cover any adaptations or variations of the embodiments discussed herein.

Thus, although the subject matter has been described in language specific to structural features and/or methodological acts, it is also to be understood that the subject matter defined in the appended claims is not necessarily limited to the specific features or acts described. Rather, the specific features and acts are disclosed as example forms of implementing the claims. This application is intended to cover any adaptations or variations of the embodiments discussed herein.

What is claimed is:

1. A non-contact electric potential meter system suitable for obtaining a determination of a voltage between a first hot conductor of a first alternating current (AC) electrical circuit and a reference potential, without direct electrical contact to the first hot conductor and without reference to a second AC voltage signal, the non-contact electric potential meter system comprising:
    a housing providing a measurement region configured to receive the first hot conductor, such that the first hot conductor is received by the measurement region without interruption of the first hot conductor; and
        wherein the measurement region in operation is configured to exclude each additional hot conductor of the first alternating current electrical circuit, such that only the first hot conductor is received by the measurement region;
    a capacitive AC voltage sensing mechanism, comprising:
        a conductive sense plate having a determinable geometric relationship to the first hot conductor when the measurement region has received the first hot conductor;
        an electrical connection to a reference potential;
        waveform-sensing electronic circuitry configured to obtain an AC voltage waveform induced by capacitive coupling between the first hot conductor and the conductive sense plate; and
        capacitance-determining electronic circuitry configured to obtain a scaling factor based on a coupling capacitance formed between the first hot conductor and the conductive sense plate;
        signal processing electronic circuitry configured to obtain, from the AC voltage waveform obtained by the waveform-sensing electronic circuitry and the coupling capacitance-based scaling factor obtained by the capacitance-determining electronic circuitry, the voltage between the first hot conductor and the reference potential; and
    power supply means configured to power the electronic circuitry.

2. The non-contact electric potential meter system of claim 1, wherein the signal processing electronic circuitry is configured to process the AC voltage waveform obtained by the waveform-sensing electronic circuitry to obtain a line voltage waveform frequency spectrum or shape, and to scale the obtained line voltage waveform frequency spectrum or shape using the scaling factor based on the coupling capacitance obtained by the capacitance-determining electronic circuitry.

3. The non-contact electric potential meter system of claim 1, wherein the waveform-sensing electronic circuitry configured to obtain an AC voltage waveform induced by capacitive coupling between the first hot conductor and the conductive sense plate comprises an amplifier circuit having an output that depends on the coupling capacitance formed between the first hot conductor and the conductive sense plate and depends on the voltage between the first hot conductor and the reference potential.

4. The non-contact electric potential meter system of claim 3, wherein the amplifier circuit comprises a transimpedance amplifier circuit having an output that scales linearly with the coupling capacitance and with the voltage between the first hot conductor and the reference potential.

5. The non-contact electric potential meter system of claim 1, wherein:
    the capacitance-determining electronic circuitry comprises coupling capacitance tracking circuitry configured to have an output frequency that depends on the coupling capacitance formed between the first hot conductor and the conductive sense plate; and
    the capacitance-determining electronic circuitry comprises scaling factor obtaining circuitry configured to obtain the scaling factor based on the output frequency of the coupling capacitance tracking circuitry.

6. The non-contact electric potential meter system of claim 1, wherein the capacitance-determining electronic circuitry comprises a circuit including an astable op-amp multivibrator that is configured to switch an output signal between an output voltage and a ground potential at a switching frequency inversely proportional to the coupling capacitance formed between the first hot conductor and the conductive sense plate.

7. The non-contact electric potential meter system of claim 1, wherein the capacitance-determining electronic circuitry comprises a calibration circuit including a relaxation oscillator, a reference capacitance to the reference potential, a switch configured to selectively connect the reference capacitance and the coupling capacitance, and circuitry configured to obtain a difference between a first frequency of the calibration circuit when the switch is open, and a second frequency of the calibration circuit when the switch is closed.

8. The non-contact electric potential meter system of claim 1, wherein the capacitive AC voltage sensing mechanism comprises:
    measurement means to obtain a determination of at least one physical dimension of the first hot conductor;
        wherein the measurement region configured to receive the first hot conductor is further configured to fix at least a portion of the first hot conductor in or against a known position; and
        wherein the measurement means are configured to obtain a determination of the at least one physical dimension of the first hot conductor when the at least a portion of the first hot conductor is fixed in or against a known position; and
    digital caliper electronic circuitry configured to obtain, based on the determination of the at least one physical dimension of the first hot conductor, a determination of a distance between the conductive sense plate and a center of the first hot conductor; and
        wherein the capacitance-determining electronic circuitry is configured to use the determined distance between the conductive sense plate and the center of the first hot conductor and the determined at least one physical characteristic of the first hot conductor to obtain the scaling factor based on the coupling capacitance formed between the first hot conductor and the conductive sense plate.

9. The non-contact electric potential meter system of claim 8, wherein the measurement means are configured to obtain a determination of a diameter of the first hot conductor including an insulating layer.

10. The non-contact electric potential meter system of claim 9, wherein the digital caliper electronic circuitry is configured to obtain a determination of a wire gauge or cross-sectional area of the first hot conductor.

11. The non-contact electric potential meter system of claim 1, wherein the first alternating current electrical circuit comprises a single-phase, two-leg, mid-point neutral split-phase electrical circuit or a two-phase, three-phase, or other multiphase electrical circuit.

12. The non-contact electric potential meter system of claim 1, wherein the housing providing the measurement region is configured such that the first hot conductor passes along, into, or through the measurement region provided by the housing.

13. The non-contact electric potential meter system of claim 1, wherein the measurement region is at least partly surrounded by a shield constructed from high-conductivity material.

14. The non-contact electric potential meter system of claim 13, wherein the shield constructed from high-conductivity material is connected to a ground potential.

15. The non-contact electric potential meter system of claim 1, wherein the electrical connection to a reference potential comprises a resistive or capacitive connection to a ground potential.

16. The non-contact electric potential meter system of claim 1, wherein the determinable geometric relationship between the conductive sense plate and the first hot conductor comprises a closest distance of up to 100 mm.

17. The non-contact electric potential meter system of claim 16, wherein the determinable geometric relationship between the conductive sense plate and the first hot conductor comprises a closest distance of between 1 mm and 15 mm.

18. The non-contact electric potential meter system of claim 1, further comprising:
   a current sensing mechanism, comprising:
      a current transformer configured to measure the current in the first hot conductor; and
      current processing electronic circuitry configured to obtain a determination of the current in the first hot conductor.

19. The non-contact electric potential meter system of claim 18, wherein the signal processing electronic circuitry is configured to process and time-synchronize a current waveform and a voltage waveform of the first alternating current electrical circuit to obtain a determination of a power factor of the first alternating current electrical circuit.

20. The non-contact electric potential meter system of claim 1, wherein the power supply means configured to power the electronic circuitry comprise energy harvesting circuitry suitable for obtaining power from the first alternating current electrical circuit.

21. The non-contact electric potential meter system of claim 20, further comprising a multiplexing circuit configured to share a current transformer between a current sensing mechanism and the energy harvesting circuitry.

22. The non-contact electric potential meter system of claim 1, further comprising a multiplexing circuit configured to selectively couple the conductive sense plate to the waveform-sensing electronic circuitry or to the capacitance-determining electronic circuitry.

* * * * *